US012700864B2

(12) United States Patent
Jansen et al.

(10) Patent No.: US 12,700,864 B2
(45) Date of Patent: Aug. 4, 2026

(54) APPROXIMATION VALUES IN LOOK UP TABLES

(71) Applicant: Hewlett Packard Enterprise Development LP, Spring, TX (US)

(72) Inventors: Nathaniel William Jansen, Houston, TX (US); Craig Warner, Plano, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 126 days.

(21) Appl. No.: 18/771,816

(22) Filed: Jul. 12, 2024

(65) Prior Publication Data

US 2026/0019085 A1 Jan. 15, 2026

(51) Int. Cl.
H03K 19/17728 (2020.01)
H03K 19/1776 (2020.01)

(52) U.S. Cl.
CPC ... H03K 19/17728 (2013.01); H03K 19/1776 (2013.01)

(58) Field of Classification Search
None
See application file for complete search history.

(56) References Cited

U.S. PATENT DOCUMENTS

| | | | |
|---|---|---|---|
| 5,862,066 A | 1/1999 | Rossin et al. | |
| 5,999,113 A | 12/1999 | Kiriyama et al. | |
| 6,064,614 A | 5/2000 | Khoury | |
| 6,344,763 B1 | 2/2002 | Aritomi et al. | |
| 7,103,756 B2 | 9/2006 | Morris | |
| 11,558,078 B1* | 1/2023 | Chandrasekaran .. | H04B 1/0475 |
| 2009/0207938 A1* | 8/2009 | Jeong ................. | H04L 25/4906 375/296 |
| 2013/0339564 A1* | 12/2013 | Nogueira ................. | G06F 1/03 710/305 |
| 2019/0147323 A1* | 5/2019 | Li .......................... | G06N 3/063 706/15 |
| 2023/0336178 A1 | 10/2023 | Stauder et al. | |
| 2024/0005138 A1 | 1/2024 | Boonstra | |

* cited by examiner

*Primary Examiner* — Anh Q Tran
(74) *Attorney, Agent, or Firm* — Slater Matsil, LLP

(57) ABSTRACT

In one implementation, a circuit includes an input having a plurality of input nodes including upper bit nodes and lower bit nodes. A look up table includes address inputs coupled to receive upper bits from the upper bit nodes. An interpolator includes an input coupled to the lower bit nodes. The interpolator is configured to simultaneously retrieve contents from a first look up table entry and a second look up table entry based on the upper bits and to estimate an approximated value using the lower bits and the contents retrieved from the first look up table entry and the second look up table entry.

18 Claims, 16 Drawing Sheets

700

702 — Receive look up table address

704 — Simultaneous retrieve contents from look up table entries

706 — Determine slope

708 — Estimate approximated value

900

902 Receive input x

904 Extract input into upper bits (Xu), middle bits (Xm), and lower bits (Xl)

906 Send upper bits (Xu) to LUT

908 Extract a row of $2^{width(Xm)}$ entries

910 Request first entry stored in row[Xm] in the row

912 Row[Xm] last entry in the row?

Yes

914a Return first entry in row[Xm] and second entry in row[Xm-1]

A

No

914b Return first entry in row[Xm] and second entry in row[Xm+1]

B

APPROXIMATION VALUES IN LOOK UP TABLES

BACKGROUND

Many computational problems in various technical fields like engineering, science, finance, and others involve performing the same or similar calculations repeatedly on different input data values. As an example, nonlinear formulas like logarithmic, trigonometric, or exponential functions may need to be calculated thousands or millions of times in applications such as neural networks, signal processing, computational fluid dynamics, financial models, and so on. Manually calculating these types of complex mathematical formulas can be computationally expensive, especially when performed repeatedly on large data sets. One approach to accelerating these calculations is to precompute the formula results for a range of input values and store the results in a look-up table (LUT). When the formula needs to be evaluated for a given input value during program execution, rather than performing the full formula calculation, the pre-computed result can simply be retrieved from the lookup table through a fast lookup operation.

BRIEF DESCRIPTION OF THE DRAWINGS

For a more complete understanding of this disclosure, and advantages thereof, reference is now made to the following descriptions taken in conjunction with the accompanying drawings, in which.

DESCRIPTION

Figure 1:
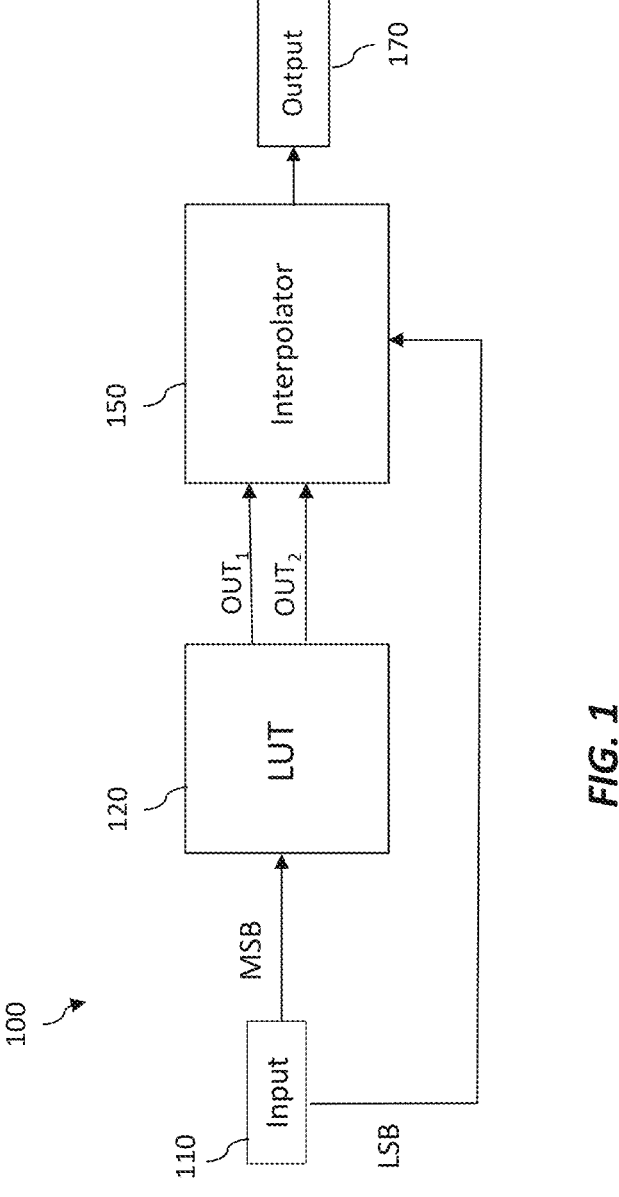
FIG. 1 depicts a block diagram of an approximation system, according to an example implementation.

The following disclosure provides many different examples for implementing different features. Specific examples of components and arrangements are described below to simplify the present disclosure. These are merely examples and are not intended to be limiting.

Look-up tables (LUT) may be used to speed up costly and complicated calculations by having pre-calculated values stored in a table in memory. The LUT provides techniques for efficiently generating, accessing, and manipulating lookup tables to approximate complex computational functions and accelerate execution of computing tasks across various technical fields. The lookup tables store pre-computed results for a range of input values to a target mathematical function, enabling fast retrieval of approximate function values through lookup operations rather than requiring the full function calculation to be performed.

Interpolation is a technique that can be employed to increase the resolution of a LUT without the need for additional data points. By leveraging the existing data within the LUT, interpolation methods estimate values between known data points, effectively creating a higher-resolution version of the original table. This process involves calculating intermediate values based on the surrounding known data points, using mathematical functions such as linear, polynomial, or spline interpolation. The chosen interpolation method depends on the nature of the data and the desired level of accuracy and any such method can be used with the implementations discussed herein.

Typically, a single value is produced upon each access to a LUT which may be, governed by, for example, five bits of an input in a 32-entry LUT. When using interpolation techniques, a singular output would require dual LUT accesses, which are inherently time-intensive due to their reliance on memory read operations. To overcome this, the LUT memory can be restructured to yield several outputs concurrently, thereby reducing access time significantly. For example, as discussed in the particular example detailed further below, four outputs may be obtained per LUT row. In an example with a five-bit address (i.e., 32 entries), an 8-row by 4-column LUT configuration can be established. The top three bits determine the row selection, while an additional two bits through a multiplexer circuit determine the resulting output.

The simultaneously obtained values can serve as reference points to ascertain intermediate values by interpolating along the linear segment defined by them. In an example implementation, linear interpolation may be used to refine the lookup table output. With linear interpolation, the output value f(x) for an input x is estimated by linearly interpolating between the two nearest values in the look up table. While the look up table provides approximate function values for the actual function values within each subrange, the input x may not correspond exactly to any of the f(x) values stored in the table. To improve the approximation accuracy, interpolation techniques can be employed to estimate a more precise function value based on the table entries.

Example implementations are predicated on utilizing the higher-order bits of the input to index a look up table (LUT) that contains data of lower precision due to the exclusion of the lower-order bits. Subsequent to this retrieval step, a combination of techniques are employed to enhance the precision of the resulting data. Additionally, there exists an option to concede a degree of this augmented precision in favor of post-LUT processing performance enhancements.

Examples disclosed herein provide improved techniques for performing activation function approximations and other computations in neural networks using lookup tables in an efficient manner that maintains model accuracy.

FIG. 1 illustrates a simplified block diagram of an approximation system 100 that utilizes a look up table 120 and an interpolator 150. The approximation system 100 comprises an input 110 that carries a number of input bits, in this example divided between most significant bits (MSB)

and least significant bits (LSB). In some implementations, the input is further divided to intermediate bits as will be described below.

The LUT 120 includes address inputs that are coupled to receive the most significant bits, which will be used to address two locations. In response the LUT 120 provides the contents $OUT_1$ and $OUT_2$ of these locations to interpolator 150.

LUT 120 can be implemented using various types of memory, depending on the specific requirements of the application. Static Random Access Memory (SRAM) is often used for small to medium-sized look-up tables due to its fast access times and low latency, making it suitable for real-time applications. For larger look-up tables, Dynamic Random Access Memory (DRAM) can be employed, as it offers higher density and lower cost per bit compared to SRAM, albeit with slower access times. In applications where the look-up table is fixed and does not require frequent updates, Read-Only Memory (ROM) can be utilized, providing non-volatile storage and low power consumption. Flash memory, another non-volatile option, allows for in-system programmability and is useful when updates to the look-up table are necessary. The choice of memory type can depend on factors such as the size of the look-up table, access speed requirements, power constraints, and the need for updates or non-volatility.

The interpolator 150 is coupled to the LUT 120 to simultaneously receive contents of the first location $OUT_1$ of the look up table and the contents $OUT_2$ of the second location in the lookup table. Typically, but not necessarily, the second location is adjacent the first location. The interpolator 150 also receives the least significant bits from the input 110. These lower order bits are used to determine an interpolated value based on the contents of the first location and the contents of the second location. Details of this interpolation will be provided with respect to the more specific implementation of FIG. 2.

Each of the examples discussed herein utilize linear interpolation since this is the simplest method to implement. Linear interpolation assumes a linear relationship between data points and calculates intermediate values using a straight line connecting two adjacent points. It is noted that the implementations are not so limited. For example, polynomial interpolation (e.g., quadratic or cubic interpolation), which uses higher-order polynomials to fit the data points, can be used to compute more accurate estimates in certain implementations when more than two entries are considered. As another example, spline interpolation (e.g., cubic splines and B-splines), which uses piecewise polynomial functions, can be used in implementations where four entries are considered. Other advanced techniques, such as Lagrange interpolation and Hermite interpolation, can also be used.

Figure 2:
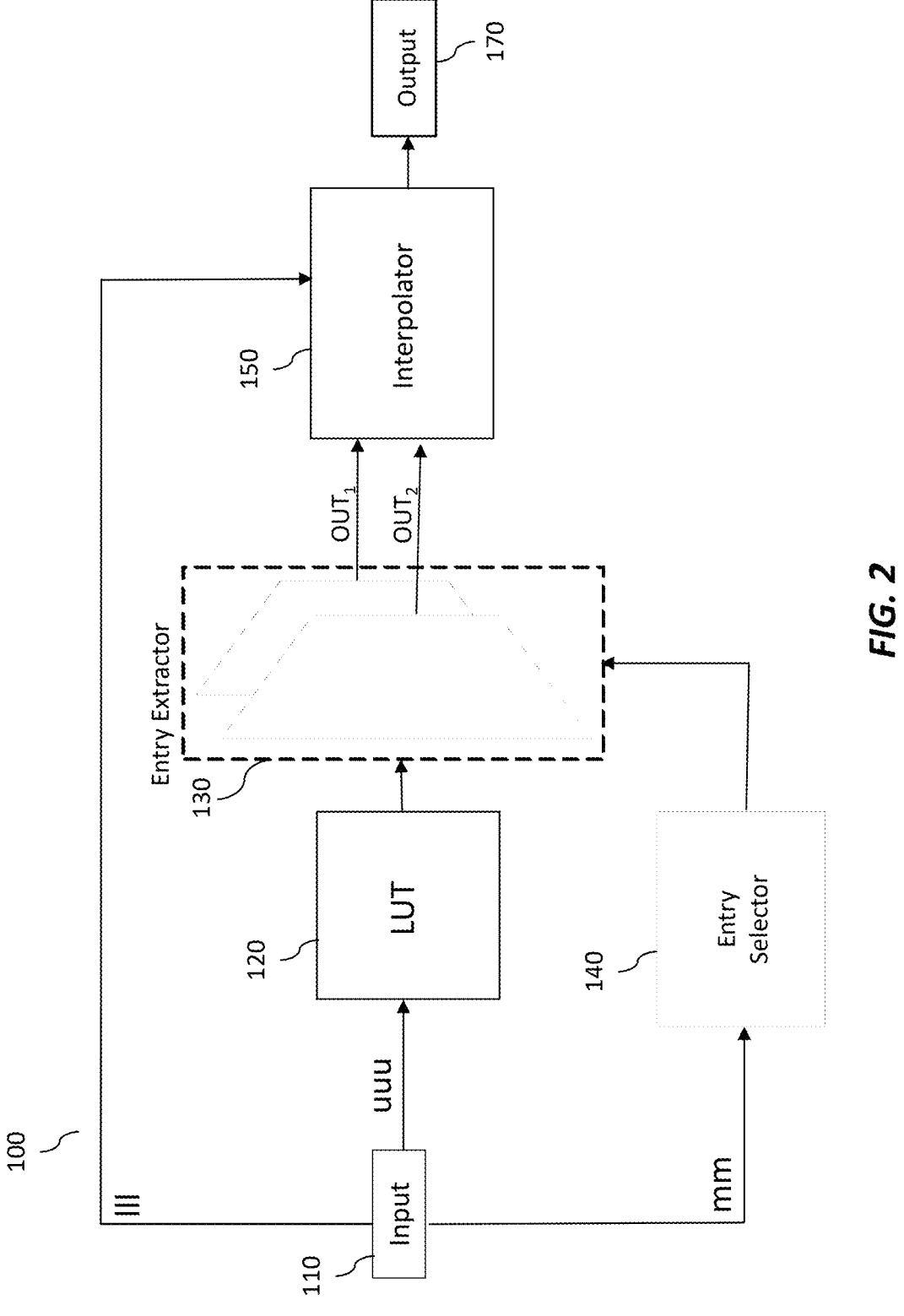
FIG. 2 depicts a block diagram of an example implementation of an approximation system.

FIG. 2 illustrates a block diagram of an approximation system 100 that utilizes a look up table by extracting a set of values and utilizing the values to interpolate intermediate values, thereby allowing for further resolution with smaller memory space. FIG. 2 will be discussed in conjunction with FIG. 3 to aid in the discussion.

Figure 3:
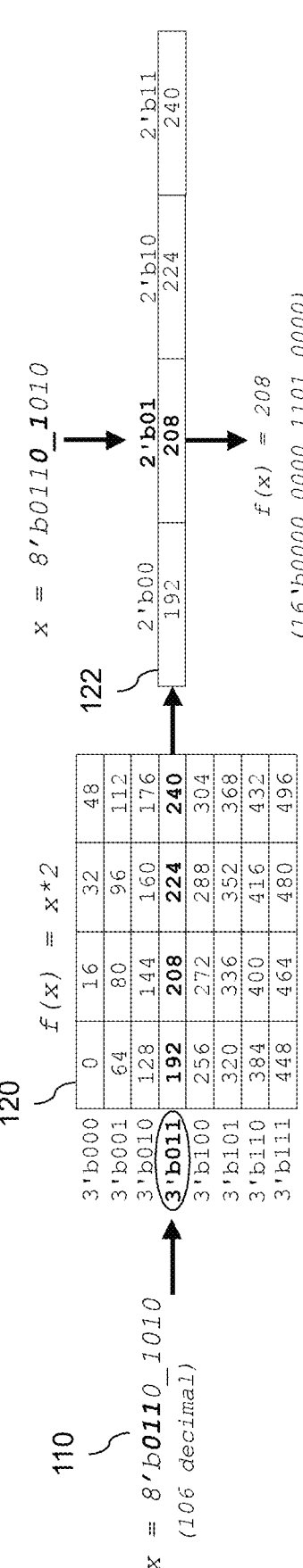
FIG. 3 depicts a look up table row extraction and bit extraction, according to an example implementation.

FIG. 3 illustrates a look up table row extraction and bit extraction according to example implementations. The approach utilized in the implementation is segmented into three principal components: an expansion of the output data path width to facilitate the concurrent production of multiple values, utilizing these values to interpolate intermediate figures using the lower-order bits, and, optionally, applying a slight modification to the interpolation computations to increase hardware calculation efficiency.

As shown in FIG. 2, the approximation system 100 includes look up table 120, entry extractor 130, entry selector 140 and interpolator 150. The most significant bits (upper bits u) are sent to the look up table 120, the intermediate order bits (middle bits m) are sent to the entry selector 140, and the least significant bits (lower bits l) are sent to the interpolator 150.

The input 110 may have any number of address bits, for example, an 8-bit input, 16-bit input, or 32-bit input. The LUT size is determined by the number of upper and middle bits of the input 110. In other words, the number of LUT entries that can be accessed is equal to $2^B$, where B is the width of upper and middle portions of the input. On the other hand, the output is entirely independent of the input and is typically similar to other data flowing through the system. In the examples discussed here, the LUT 120 stores pre-calculated values for a computational function f(x).

One feature of this implementation is that the number of values of the function f(x) that are stored will be $2^{u+m}$, where u is the number of upper bits and m is the number of middle bits. The output 170, however, will receive a result of the function that is selected from $2^{u+m+l}$ values, l being the number of lower bits. The interpolator 150 is used to estimate the more precise value based on the lower bits and the outputs of the extractor 130.

In operation, the LUT 120 receives upper bits u to locate a row of entries 122 on the look up table 120. For example, as shown in FIG. 3, the input 110 is an 8-bit value, with an arbitrarily selected input x that is 0110_1010. In this example, the determined LUT size is 4×8 or a 32-entry LUT containing values for the function f(x)=x*2. The upper bits u of the input 110 are used to locate a row of entries 122 from the LUT 120. In this example, the upper bits u are 011 so the fourth row (labeled 3'b011) of the LUT 120 is set as the input to the entry extractor 130. (In this nomenclature "3'b" indicates three bits.) The size of the memory implementing the LUT would be the LUT size times the number of bits for each entry.

The entry extractor 130 is coupled to the output of the LUT 120. The extracted row of entries from the LUT 120 serves as the input to the entry extractor 130. The row of entries from the LUT 120 is extracted based on the upper bits u of the input 110. Referring to FIG. 3, for example, the fourth row (labeled 3'b011) of LUT 120 containing the entries 2'b00, 2'b01, 2'b10, and 2'b11 and the corresponding values 192, 308, 324, and 340 are the inputs of the entry extractor 130. The entry extractor 130 may be a combinational logic circuit, for example, the entry extractor 130 may include a plurality of multiplexers.

The entry selector 140 can utilize the middle bits m of the input 110 to determine which entry and adjacent entry will be used in to calculate the approximated value 170 and whether the entry is a last entry of the row on the LUT 120. The middle bits m are sent to the entry selector 140 to select an entry N and an adjacent entry N+1 or N−1. The entry selector 140 outputs are coupled to control inputs of the entry extractor 130 to select the first entry N or N−1 and the second entry N+1 or N from the row of values input to the entry extractor 130. When the entry selector 140 selects the last entry in the row, typically when the middle bits m are the largest unsigned number for a given width, the first output is equal to N−1 and the second output is equal to N. For example, when the entry selector selects the last entry in the row or m=2'b11, the first output N−1=2'b10 and the second output is N=2'b11. Otherwise, the first output is equal to N and the second output is equal to N+1. For example, in FIG.

3, the middle bits m is 01 so the first output is N=2'b01 and the second output is N+1=2'b10.

In most cases, middle bits m are not the maximum value. In these cases, the entry extractor 130 can utilize the output of the entry selector 140 to extract an entry N containing a first value and an adjacent entry N+1 containing a second value among the row of entries received from the LUT 120. For example, referring to FIG. 3, the middle bits m is 2'b01 so the entry N is 2'b01. The entry N+1 corresponds to an entry adjacent to entry N. In this example, the entry N+1 is 2'b10. In this example, the first value stored in N=2'b01 is 308 and the second value stored in N+1=2'b10 is 324.

The output of the entry extractor 130 is coupled to the interpolator 150. The interpolator 150 receives the first value and the second value output by the entry extractor 130. The interpolator 150 calculates a slope between the first value and the second value. The interpolator 150 utilizes the lower bits l to determine a partial value along the slope between the N and N+1 values. The partial value is added to or subtracted from the first value to determine the approximated value.

Figure 4A:
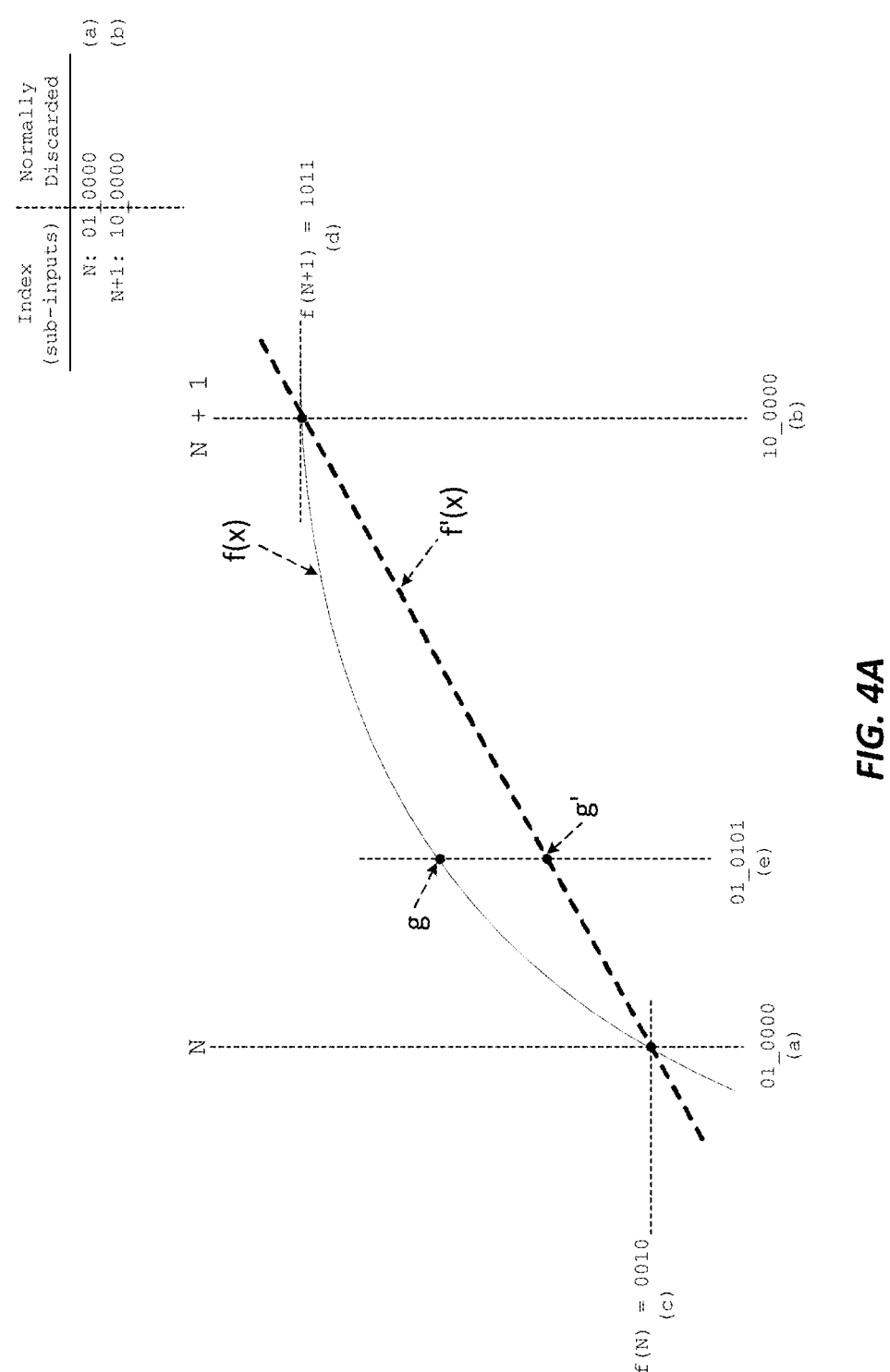
FIGS. 4A-4B (collectively FIG. 4) depict functions f(x) and approximation functions f'(x), according to an example implementation.
Figure 4B:
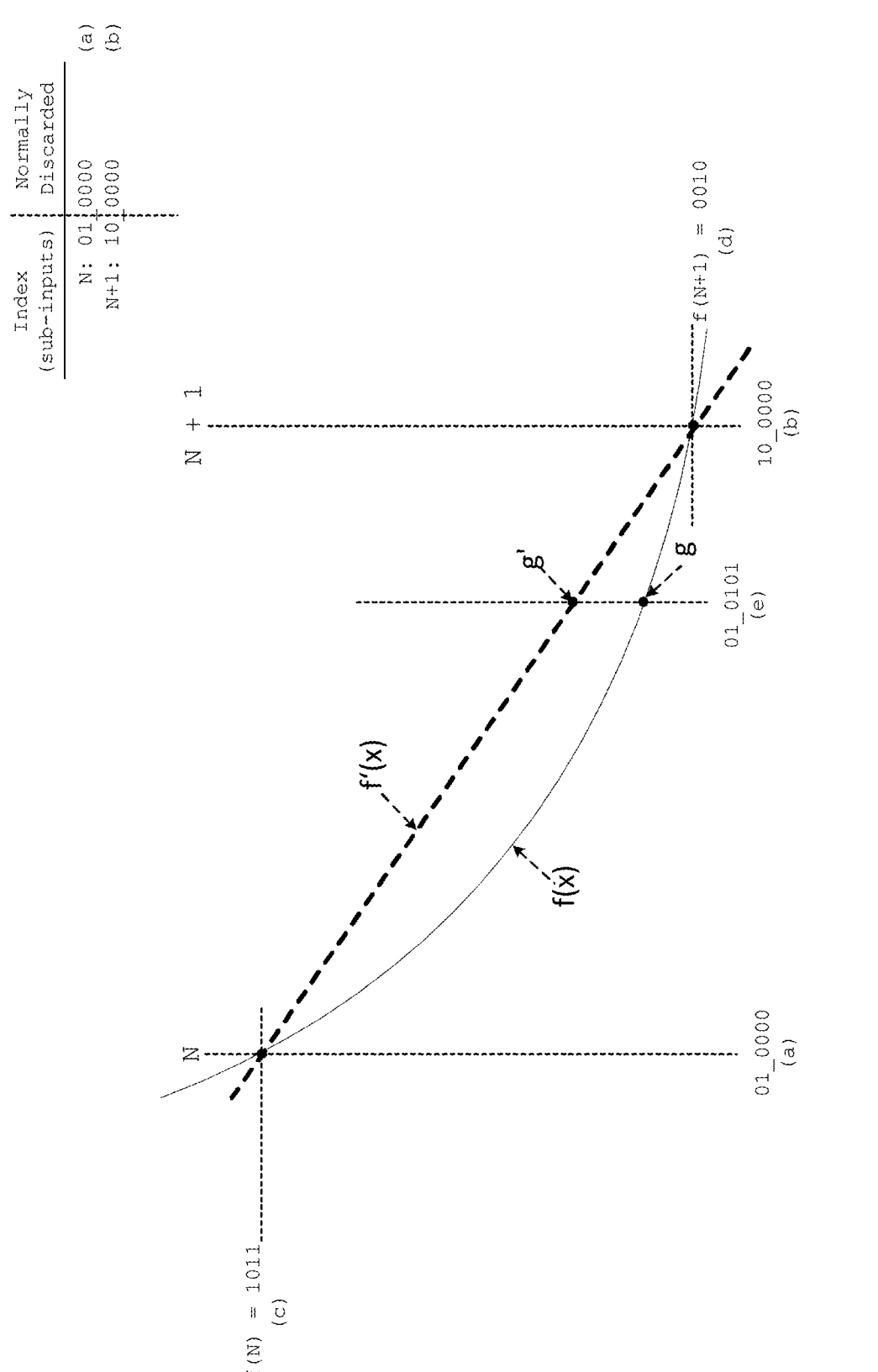

FIGS. 4A-4B illustrate graphs of actual functions f(x) and approximation functions f'(x), according to an example implementation. FIG. 4A illustrates an example of an actual function f(x) and an approximation function f'(x) having a positive slope. FIG. 4B illustrates an example of an actual function f(x) and an approximation function f'(x) having a negative slope.

Referring to FIGS. 4A-4B, the actual function f(x) corresponds to the function f(x) of the LUT 120 previously discussed with respect to FIGS. 1 and 2. The data points f(N) and f(N+1) correspond to the pre-calculated values stored in the LUT 120. The vertical dashed lines a and b represent the N and N+1 entries in the LUT 120, which have values of c and d. The data point f(N) has an x-coordinate represented by a and a y-coordinate represented by c. The data point f(N+1) has an x-coordinate represented by b and a y-coordinate represented by d.

The function f'(x) is an approximation function of the actual function f(x). The data point g represents an actual value between two pre-calculated values stored on the LUT 120. The data point g' is an approximated value of the actual data point g. The data points g and g' have an x-coordinate represented by e. The x-coordinate e corresponds to a requested value based on the lower bits of input 110 sent to the interpolator 150 to determine a partial value along the slope.

As shown, for example, in FIG. 4A, when the approximation function f'(x) is a positive slope, the approximated value g' can be determined by the following formula:

$$g' = c + e\frac{(d-c)}{(b-a)}$$

As shown, for example, in FIG. 4B, when the approximation function f'(x) is a negative slope, the approximated value g' can be determined by the following formula:

$$g' = c - e\frac{(c-d)}{(b-a)}$$

Figure 5:
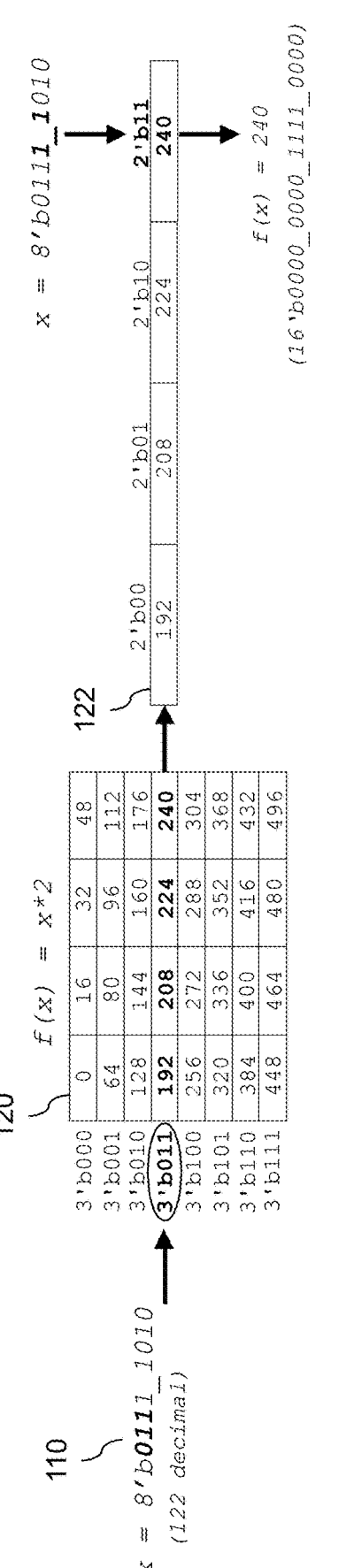
FIG. 5 depicts a look up table row extraction and bit extraction for an end-of-row case, according to an example implementation.

The calculations described with respect to FIGS. 4A and 4B assume that the values c and d, corresponding to lower order address locations a and b are available. This assumption will not hold true in the case that the contents at address location b have not been retrieved along with the contents of address location a, e.g., when the lower order bits are 2'b11 for address a in the example of FIG. 3. One solution is to dynamically adjust which LUT entries are provided to the interpolator. FIGS. 5-6 demonstrate another solution.

FIG. 5 illustrates an example of an end-of-row case when a requested entry is the last entry on the extracted row of entries of the LUT 120. As previously discussed with respect to FIG. 3, the middle bits m are sent to the entry selector 140 to select an entry N and an adjacent entry, N−1 in this case since the middle bits m of the input is the largest unsigned number that can be represented by the width of middle bits.

Consider the example of FIG. 5 where the middle bits m are 2'b11 so the entry N is 2'b11 from row 3'b011 and the entry N+1 is 2'b00 from row 3'b100. Here, the first value stored in N=2'b11 is 240 and the second value stored in N+1=2'b10 is 256 so the interpolated value would be between (or equal to) one of these values. As shown in the figure, however, only one of the values has been retrieved from the LUT. As such, it is not possible to perform the interpolation described with respect to FIG. 3. In this case, the interpolator can retrieve entries N and N−1 and use these to estimate an ~N+1 value.

Figure 6A:
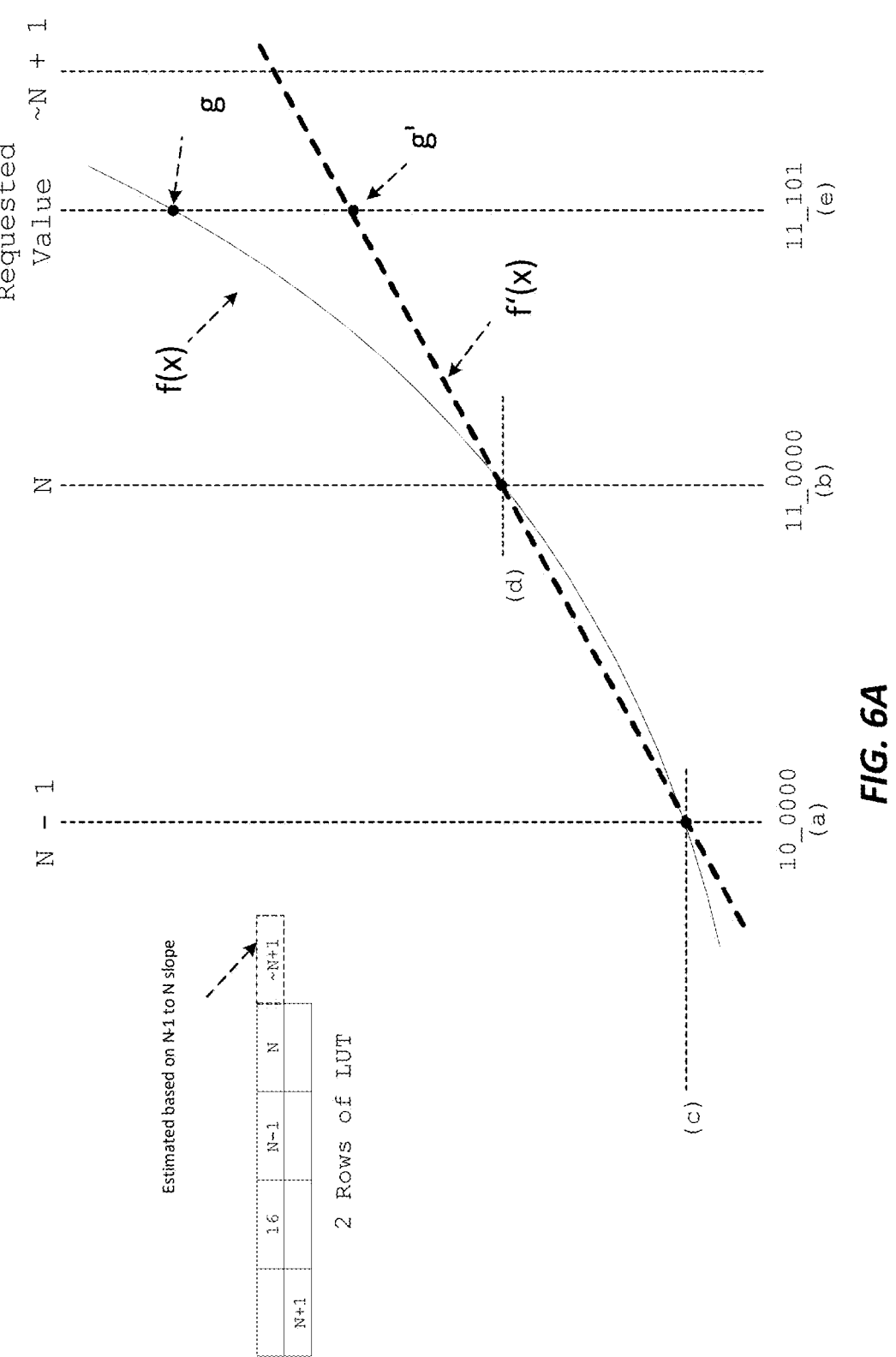
FIGS. 6A-6B (collectively FIG. 6) depict functions f(x) and approximation functions f'(x) for an end-of-row case, according to an example implementation.
Figure 6B:
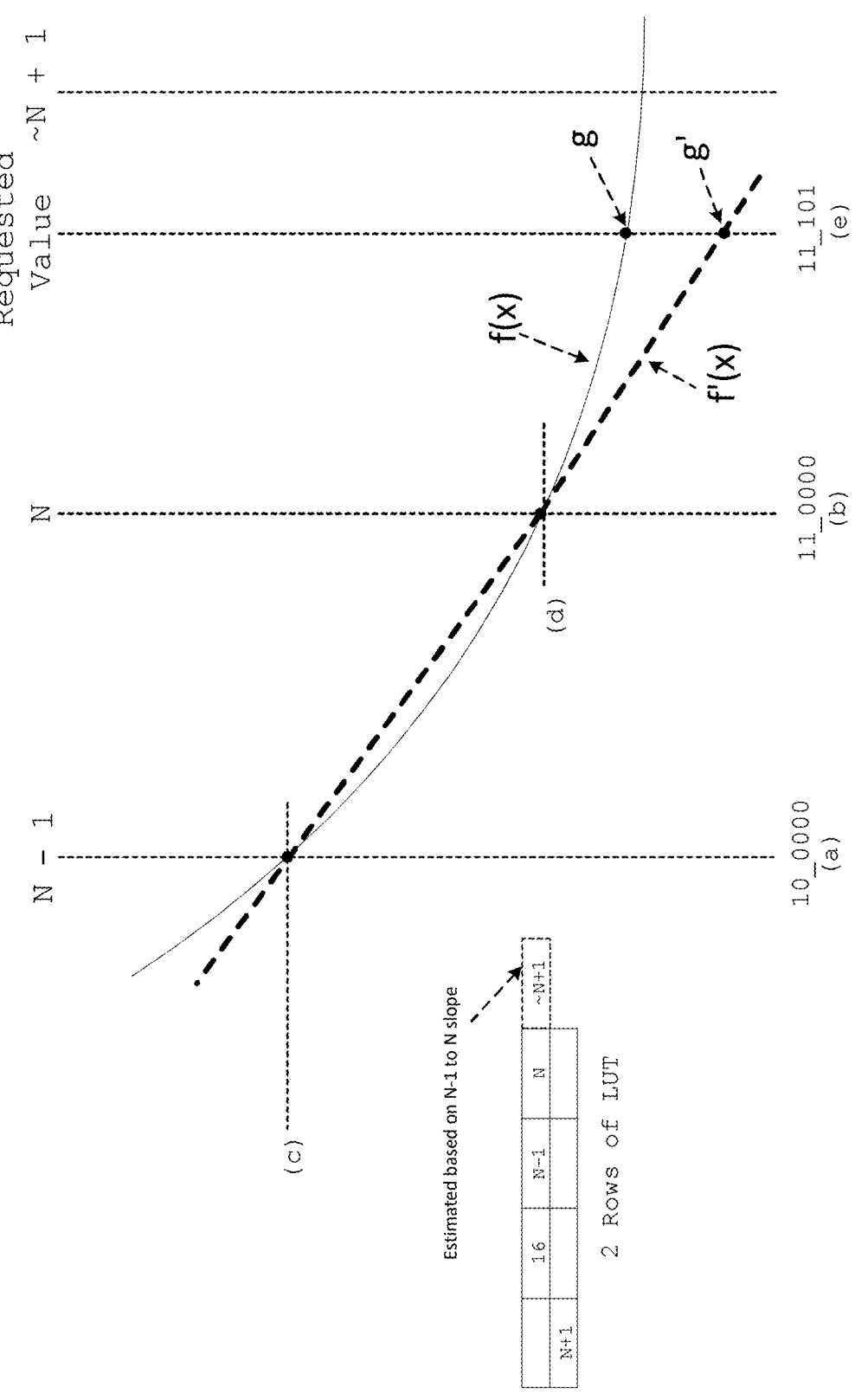

Referring to FIGS. 6A-6B, the actual function f(x) corresponds to the function f(x) of the LUT 120 previously discussed with respect to FIGS. 1 and 4. The data points f(N−1) and f(N) correspond to the pre-calculated values stored in the LUT 120. The vertical dashed lines a and b represent the N−1 and N entries in the LUT 120 and have values of c and d. This figure also shows the N+1 entry, which is presented by value e.

The data point g represents a requested value outside the pre-calculated values stored on the row of entries 122 extracted from the LUT 120. When the requested value based on the middle bits mm is the largest unsigned number represented by the width of the middle bits, the slope can be extrapolated to estimate the next value ~N+1. The function f'(x) is an approximation function of the actual function f(x) and data point g' is an approximated value of the actual data point g. The data points g and g' have an x-coordinate represented by e. The x-coordinate e corresponds to the lower bits of input 110 sent to the interpolator 150 to determine a partial value along the slope.

As shown, for example, in FIG. 6A, when the approximation function f'(x) is a positive slope, the approximated value g' can be determined based on the following formula:

$$g' = d + e\frac{(d-c)}{(b-a)}$$

As shown, for example, in FIG. 6B, when the approximation function f'(x) is a negative slope, the approximated value g' can be determined based on the following formula:

$$g' = d - e\frac{(c-d)}{(b-a)}$$

In this example, the speed gained by retrieving the entries at the same time is achieved by the possible sacrifice of having a potentially less accurate value obtained by extrapolating the value g' based on the two proceeding known values. Simulations have determined that the effect of this estimation can be small.

Figure 7:
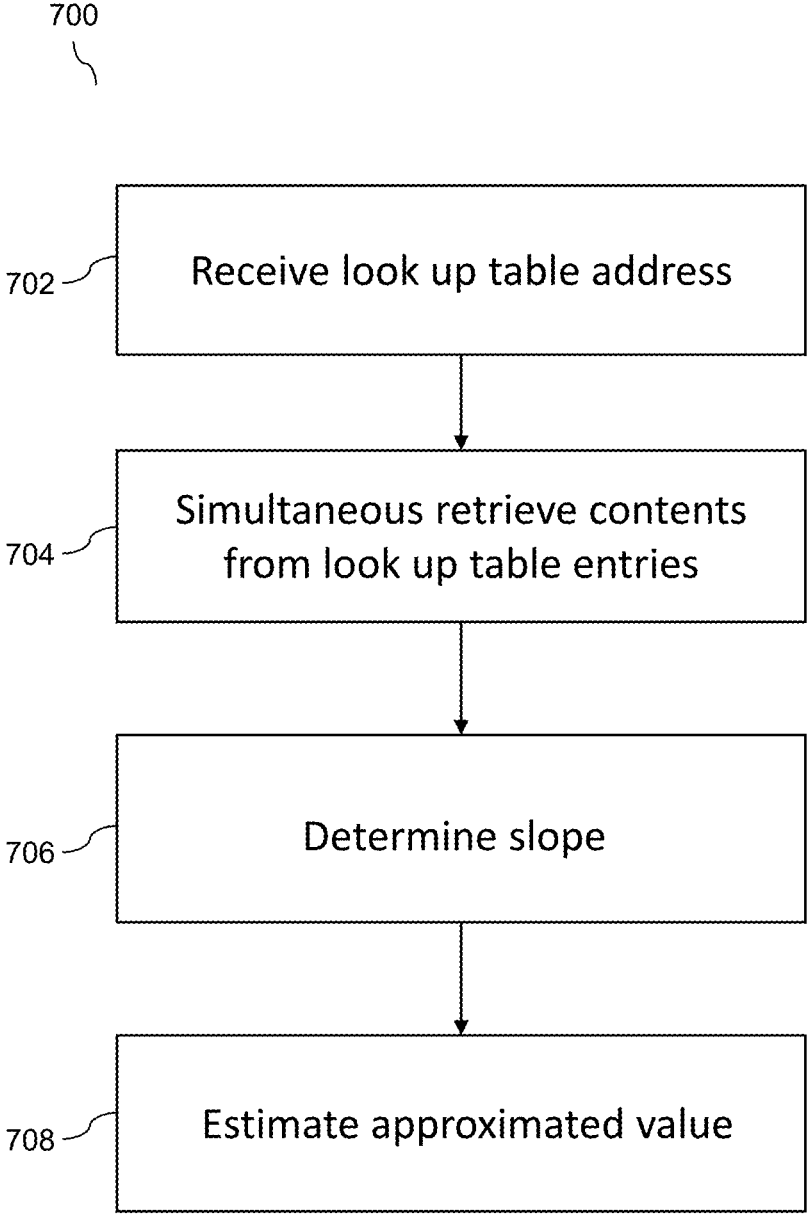
FIG. 7 depicts a flowchart of an approximation system, according to an example implementation.

FIG. 7 depicts a flowchart 700 of estimating an approximated value from a look up table (LUT), according to example implementations. The process begins at step 702, which involves receiving a look up table address. The look up table address corresponds to a look up table storing contents of a computation in memory. The look up address may be an 8-bit address, 16-bit address, or 32-bit address, for example. The look up table address includes most significant bits, next most significant bits, and least significant bits. The next most significant bits are the bits between the most significant bits and the least significant bits.

The LUT includes a plurality of look up table entries organized in rows and columns. The most significant bits identify a row of entries on the LUT and the next most significant bits identify a column corresponding to the row of entries. The number of LUT entries is determined by the width of the most significant bits of the look up table address. The number of LUT entries needed can be determined by $2^{WU}$, where WU is the width of the most significant bits of a look up table address.

Following receiving the look up table address, the process moves to step 704 where contents of the look up table entries are simultaneously retrieved. The contents are stored in a row of look up table entries based on the most significant bits. The number of entries in a single row can be determined by $2^{WM}$, where WM is the width of the next most significant bits of a look up table address. The stored contents includes pre-calculated values for the computation. The contents may be stored, for example, in a first look up table entry and an adjacent second look up table entry on a common row of the LUT. The first look up table entry and the adjacent second look up table entry are determined by the most significant bits and the next most significant bits.

The retrieved contents are used to determine a slope in step 706. The slope may be determined based on the contents stored in the first look up table entry and the contents of the second look up table entry. The slope may be a positive slope or negative slope.

Following determining the slope in step 706, the process moves to step 708 to estimate an approximated value. The approximated value can be estimated based on the least significant bits of the look up table address receiving in step 702, the determined slope in step 706, and the contents of the first look up table entry retrieved in step 704.

In some aspects, estimating the approximated value includes determining a partial value based on the determined slope and adding or subtracting the partial value to the contents of the first look up table entry. The partial value may be determined by calculating a difference between the contents of the first look up table entry and the contents of the second look up table entry, rounding the least significant bits to a nearest power of two in parallel with calculating the difference, and performing a bit shifting calculation on the rounded least significant bits. The bit shifting calculation may include shifting the rounded least significant bits left and shifting the left-shifted rounded least significant bits right by $2^{WL}$, where WL is a width of the least significant bits.

In some aspects, when the first look up table entry precedes the second look up table entry and the determined slope is a positive slope, the partial value is added to the contents of the first look up table. When the first look up table entry precedes the second look up table entry and the determined slope is a negative slope, the partial value is subtracted from the contents of the first look up table.

In some aspects, when the first look up table entry is a last entry of the row, as shown in FIG. 5, and the second look up table entry therefore is a second-to-last entry of the row and the determined slope is a positive slope, the partial value is added to the contents of the first look up table. When the first look up table entry is a last entry of the row, as shown in FIG. 5, and the second look up table entry is a second-to-last entry of the row and the determined slope is a negative slope, the partial value is subtracted from the contents of the first look up table.

Figure 8A:
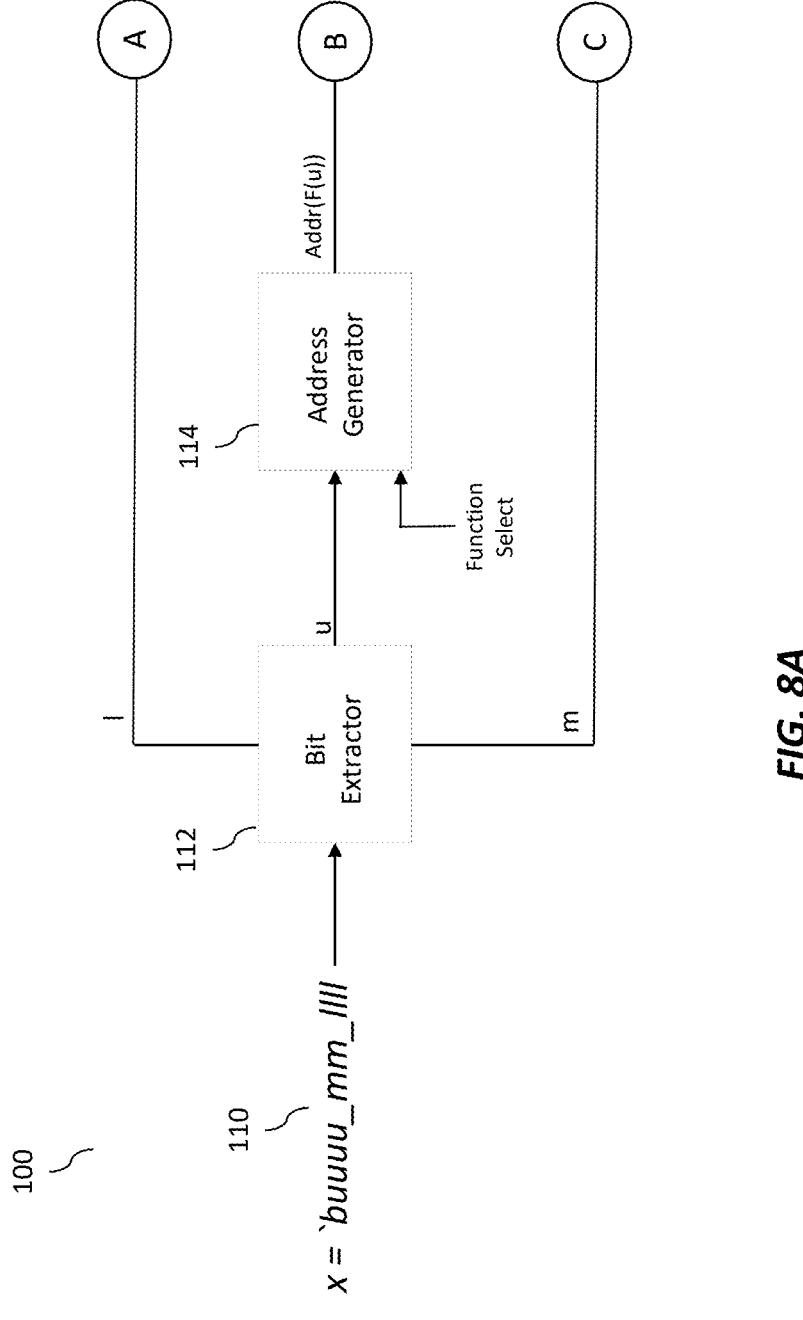
FIGS. 8A-8C (collectively FIG. 8) depict a block diagram of an approximation system, according to an example implementation.
Figure 8B:
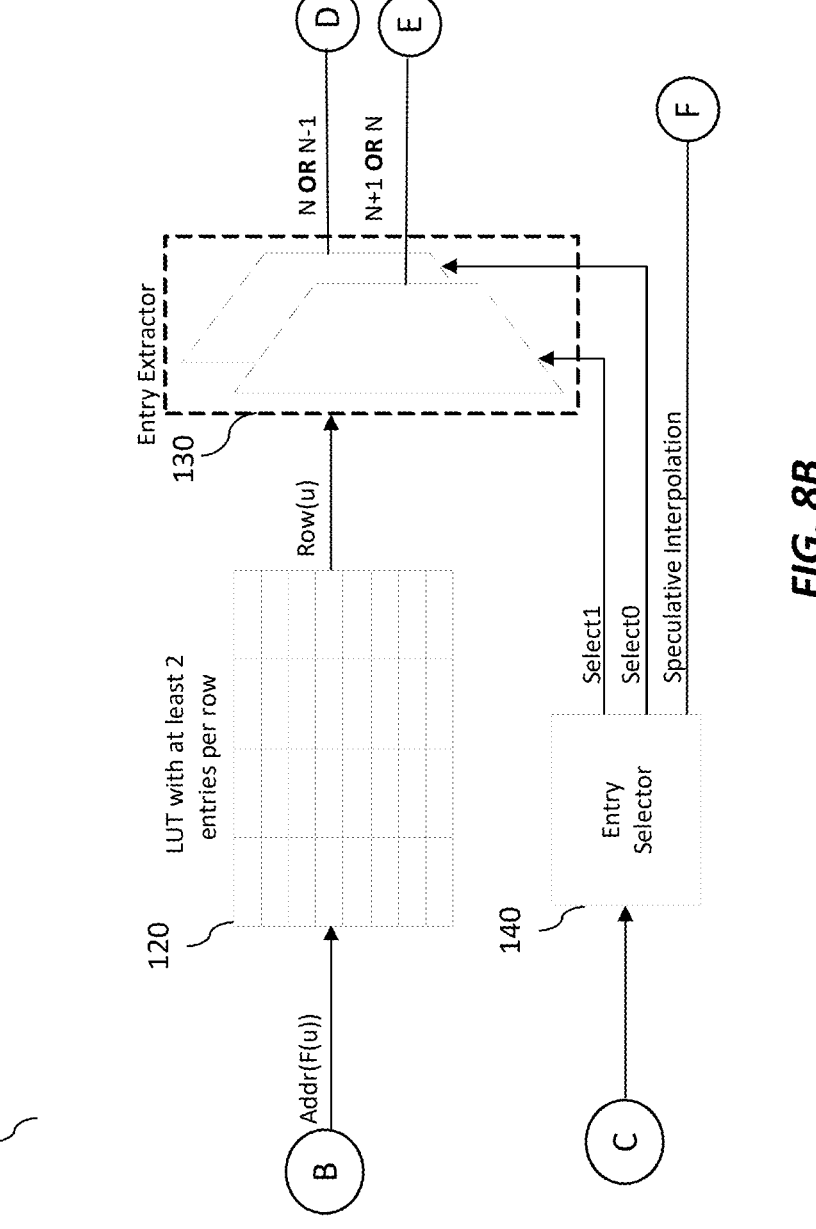
Figure 8C:
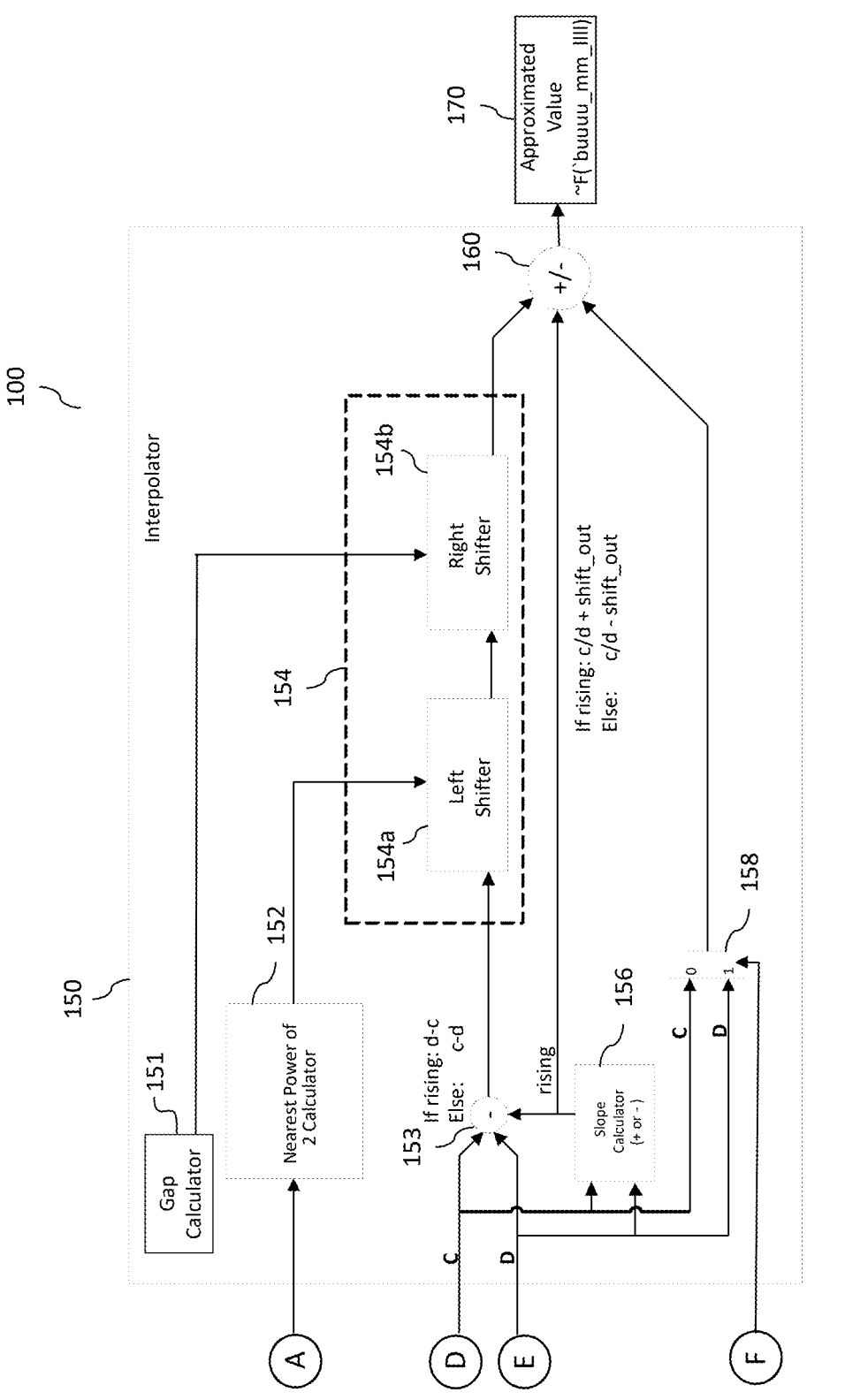

FIG. 8, which has been divided into FIGS. 8A-8C for simplicity of reading, illustrates a block diagram of approximation system 100, according to an example implementation. This figure illustrates a block diagram of an approximation system 100 that utilizes a look up table (LUT) by extracting contents of the LUT to estimate an approximated value. This example provides a more detailed implementation, which can be modified based on the particular requirements of a given system.

As shown in FIG. 8A, the approximation system 100 includes an input 110, a bit extractor 112, and an address generator 114. At input 110, a requested input x is applied to the approximation system 100 to estimate an approximated value from a LUT. The input 110 includes upper bits u (most significant bits), middle bits m (intermediate significant bits), and lower bits l (least significant bits). The input 110 is coupled to the bit extractor 112. The bit extractor 112 extracts the upper bits u, middle bits m, and lower bits l provided by the input 110.

At the bit extractor 112, the upper bits u are sent to an upper bit node, the middle bits m are sent to a middle bit node, and lower bits l are sent to a lower bit nodes. For example, as shown in FIG. 8A, the input 110 is x=uuuu_mm_llll, the upper bits "uuuu" are sent to the upper bit node, the middle bits "mm" are sent to the middle bit node, and the lower bits "llll" are sent to the lower bit nodes. Although this example implementation includes a 10-bit input, the input x can be of any size and the width of upper, middle, and lower bit portions can be of any size. For example, as shown in FIG. 8A, the input 110 has an upper bit width of 4 (uuuu_), but this portion could be wider (e.g., uuuuuu_) or narrower (e.g., uuu_) depending on the system requirements for LUT size. Similar is true for the middle bits, mm, and the lower bits, llll.

The bit extractor 112 is coupled to the address generator 114, an entry selector 140, and an interpolator 150. In this example implementation, the upper bit node is coupled to the address generator 114, the middle bit node is coupled to the entry selector 140 (in FIG. 8B), and the lower bit node is coupled to the interpolator 150 (in FIG. 8C).

The address generator 114 utilizes the upper bits u to generate an address Addr(F(u)). The address generator 114 may include two inputs. The first input, which includes four parallel lines in this example, may be coupled to the upper bit node of the bit extractor 112. The second input may be coupled to a Function Select input, which input may be utilized to select one of a number of LUTs stored in the memory at different offsets. Each of the LUTs stores pre-calculated values corresponding to different functions. The selected LUT contains the pre-calculated values to a function f(x).

The address Addr(F(u)) corresponds to multiple entries of the look up table stored in one row that correspond to a computation of the function f(x) as shown in FIG. 8B. In this case, LUT size is determined by the number of upper bits u and middle bits m. The address generator receives the upper bits to select one of $2^U$ addresses. Each row has $2^M$ entries that are retrieved in parallel. As such, the LUT includes $2^{M+U}$ entries. In the example where u=4 and m=2, the LUT stores $2^6$=64 values, where one of 16 ($2^4$) rows is addressed and 4 ($2^2$) values are output from that row.

It is understood that this particular size memory is used solely as an example. Any size LUT can utilize the techniques discussed herein. The number of row addresses and the number of entries retrieved in parallel is a matter of design choice, as is the resolution of the adjustment factor determined by interpolation. In addition, although FIG. 8B shows one look up table, the approximation system 100 may include a plurality of look up tables 120 as noted above.

The output of the LUT 120 is coupled to an entry extractor 130. The LUT 120 outputs a selected row of entries row(u) based on the address Addr(F(u)) which corresponds to the upper bits of the input 110. The pre-calculated values stored in the selected row(u) are coupled to the input of the entry extractor 130.

In one implementation, the entry extractor 130 may include one or more multiplexers having a number of inputs corresponding to the number of entries in a row of the LUT 120. For example, an entry extractor 130 coupled to a 16×64 LUT would require a combination of multiplexers to implement a 64:1 MUX. The entry extractor 130 may have a first multiplexer with a data input coupled to an output of the LUT 120 and a control input coupled to a first output Select0 of an entry selector 140. A second multiplexer may have a data input coupled to the same output of the LUT and a control input coupled to a second output Select1 of the entry selector 140. The select signals Select1 and Select2 are based on the middle bits m.

The multiplexers are simply one example of how to implement the entry extractor 130. One way to implement a multiplexer function is to use a standard approach with AND gates, OR gates, and inverters. One alternative is to use a combination of tri-state buffers and a decoder. The decoder selects which input signal is passed through to the output based on the select lines, while the tri-state buffers ensure that only the selected input is connected to the output at any given time. Another option is to use transmission gates, e.g., switched pass transistors controlled by the select lines to route the desired input signal to the output.

The input of the entry selector 140 is coupled to the middle bit node of the bit extractor 112. The entry selector 140 utilizes the middle bits m of the input 110 to select an entry and adjacent entries, for example, entry N and adjacent entry N+1 or N−1. The entry selector 140 outputs are coupled to control inputs or data select lines of the entry extractor 130 to select the first entry N or N−1 and the second entry N+1 or N from the row of values row(u) on the LUT 120. While FIG. 8B illustrates an entry selector 140 having three outputs, the entry selector may have a plurality of outputs proportional to a number of control inputs at the entry extractor 130.

In one example implementation, the outputs of the entry selector 140 may include a first output Select0 to select an entry N or N−1, a second output Select1 to select an entry N+1 or N, and a Speculative Interpolation that outputs 1 when N is the last entry in row(u), e.g., the middle bits m is the largest unsigned number represented by the width of the middle bits. In this example, when the middle bits m is the largest unsigned number represented by the width of the middle bits m, the first output Select0 is equal to N−1, the second output Select1 is equal to N, and the Speculative Interpolation output is 1.

Referring to FIG. 3, for example, the middle bits m is 2'b01 so Select0 output is N=2'b01, Select1 output is N+1=2'b10, and the Speculative Interpolation output is 0. As another example, referring to FIG. 5, the middle bits m is 2'b11 so Select0 output is N−1=2'b10, Select1 output is N=2'b11, and Speculative Interpolation output is 1.

Table 1 below provides an example of inputs and corresponding outputs of an entry selector 140 having a 2-bit input or when the middle bits portion is 2-bit wide. The Entry selector Input column corresponds to the input of the entry selector 140 and Select0, Select1, and Speculative Interpolation corresponds to the outputs of the entry selector 140.

TABLE 1

| Entry Selector Input | Select0 | Select1 | Speculative Interpolation |
|---|---|---|---|
| 00 | 00 | 01 | 0 |
| 01 | 01 | 10 | 0 |
| 10 | 10 | 11 | 0 |
| 11 | 10 | 11 | 1 |

Referring again to FIG. 8, the lower bit node of the bit extractor 112, outputs of the entry extractor 130, and an output of the entry selector 140 are coupled to inputs of the interpolator 150 (FIG. 8C). As discussed above, any type of interpolator can be used. In the illustrated implementation, the interpolator 150 includes a nearest power of two calculator 152, a subtractor 153, a shifter 154, a slope calculator 156, and a 2:1 multiplexer (MUX) 158. The nearest power of two calculator 152, the subtractor 153, the shifter 154, and the slope calculator 156 operate together to determine a partial value or shift_out value. The partial value or shift_out value is added or subtracted to the first value c or second value d to calculate an approximated value 170.

The nearest power of two calculator 152 is coupled to the lower bit node of the bit extractor 112. The calculator 152 can be implemented in binary logic by taking a binary input number and outputting the nearest power of 2. In one implementation, the calculator 152 can be designed using a priority encoder and a decoder. The priority encoder identifies the position of the most significant '1' bit in the input binary number, which determines the nearest power of 2, and outputs a binary code corresponding to the position of the most significant '1' bit. The decoder then takes the output of the priority encoder and generates the corresponding binary representation of the nearest power of 2. For example, if the input binary number is "1010" (decimal 10), the priority encoder identifies that the most significant '1' bit is at position 3 (starting from the right, 0-indexed) and outputs the binary code "11" (decimal 3). The decoder takes the binary code "11" and generates the corresponding nearest power of 2, which is "1000" (decimal 8). The nearest power of two calculator 152 may be implemented in combinational logic and may be executed in parallel with the LUT extraction process. For example, it can be implemented using basic logic gates such as AND, OR, and NOT (i.e., inverter) gates.

Power-of-two multiplication can be achieved by shifting the other value left or right, depending on whether the multiplication or division is by the power of two. This is much more computationally efficient than doing full multiplication or division (with something like a Wallace Tree multiplier) in terms of both computation time, and how the number of gates scales as the operands get wider. The nearest power of two calculator 152 can modify the x-coordinate e that corresponds to a requested value based on the lower bits of input 110 sent to the interpolator. This approximation does not significantly impact the accuracy of the calculations and still outperforms the method of dropping lower bits. The nearest power of two calculator 152 can modify the e value in each equation, described with respect to FIGS. 4A-4B and 6A-6B, by rounding e to the nearest power of 2 represented by nearest_pow2[e]. For example:

When the approximation function f'(x) is a positive slope and the data points are f(N) and f(N+1) corresponding to the pre-calculated values stored in the LUT 120, the approximated value g' can be determined by the following formula:

$$g' = c + \text{nearest\_pow2}\,[e]\,\frac{(d-c)}{(b-a)}$$

When the approximation function f'(x) is a negative slope and the data points are f(N) and f(N+1) corresponding to the pre-calculated values stored in the LUT 120, the approximated value g' can be determined by the following formula:

$$g' = c - \text{nearest\_pow2}\,[e]\,\frac{(c-d)}{(b-a)}$$

When the approximation function f'(x) is a positive slope and the data points are f(N−1) and f(N) corresponding to the pre-calculated values stored in the LUT 120, the approximated value g' can be determined based on the following formula:

$$g' = d + \text{nearest\_pow2}\,[e]\,\frac{(d-c)}{(b-a)}$$

When the approximation function f'(x) is a negative slope and the data points are f(N−1) and f(N) corresponding to the pre-calculated values stored in the LUT 120, the approximated value g' can be determined based on the following formula:

$$g' = d - \text{nearest\_pow2}\,[e]\,\frac{(c-d)}{(b-a)}$$

The nearest power of two calculator 152 can be performed entirely in minimal levels of combinational logic immediately after the values are ready from the Read-Only Memory (ROM) lookup, resulting in a relatively quick operation. Furthermore, the setup of the equations ensures that the denominator (b-a) will be a power of 2 without any estimation or rounding necessary, further simplifying the computation.

The input of the slope calculator 156 is coupled to the output of the entry extractor 130. Operation can be understood with reference to the examples of FIGS. 3-6. The slope calculator 156 receives a first pre-calculated value c stored in the first entry N or N−1 and a second pre-calculated value d stored in the second entry N+1 or N output from the entry extractor 130. The first pre-calculated value c has a coordinate (a, c) and the second pre-calculated value has a coordinate (b, d). The slope calculator uses the coordinates of the pre-calculated values c and d to determine the slope where the slope is equal to $$\frac{d-c}{b-a}.$$

The output of the slope calculator 156 is coupled to the subtractor 153 to determine which of c and d is the subtrahend, and which is the minuend and an adder/subtractor 160 to determine the correct operation to find the approximated value 170.

The input of the subtractor 153 is coupled to the output of the entry extractor 130 and the slope calculator 156. The subtractor 153 receives the pre-calculated values c and d from the entry extractor 130 and the positive or negative slope from the slope calculator. When the slope calculator 156 outputs a positive slope, the subtractor 153 outputs a resulting value of d-c to the shifter 154. When the slope calculator 156 outputs a negative slope, the subtractor 153 outputs a resulting value of c-d.

The output of the subtractor 153 is coupled to the shifter 154. In some implementations, the shifter 154 includes a left shifter 154a and a right shifter 154b. The left shifter 154a is coupled to the output of the nearest power of two calculator 152 and the output of the subtractor 153. The left shifter 154a receives the resulting value of d-c or c-d from the output of the subtractor 153. The left shifter 154a performs a left shift to the resulting value. The resulting value is shifted left by the rounded lower bit value of the nearest power of two calculator.

The right shifter 154b receives the left shifted resulting value from the left shifter 154a and a gap calculation b-a. A gap calculator 151 calculates a distance between the x-coordinates a and b of the pre-calculated values c and d. The right shifter 154b shifts the left shifted resulting value by $2^{WL}$, where WL is the width of the lower bits. The shifter 154 outputs a partial value or shift_out value. The shifter 154 or right shifter 154b is coupled to the adder/subtractor 160.

While the multiplication function is described herein as being performed using a nearest power of 2 calculator and shifter, it is understood that any multiplier circuit can be used. The implementation shown in FIG. 8C-8D will speed up the calculation but at the expense of accuracy.

One example of a multiplier circuit comprises a grid of AND gates and a series of full adders. Each AND gate in the grid takes one bit from the multiplicand and one bit from the multiplier as inputs, and its output represents a partial product. The AND gates are arranged in rows and columns, with each row corresponding to a bit of the multiplier and each column corresponding to a bit of the multiplicand. The outputs of the AND gates are then connected to the inputs of the full adders. The full adders are arranged in a cascade, with the least significant bits of the partial products being added first, and the carry bits from each adder being propagated to the next adder in the cascade. The number of full adder stages in the cascade is equal to the sum of the number of bits in the multiplicand and multiplier minus one. The final stage of the full adder cascade produces the most significant bits of the product, while the earlier stages produce the less significant bits. The complete binary multiplier circuit takes the multiplicand and multiplier as inputs and produces their product as the output, with the number of output bits being equal to the sum of the number of bits in the multiplicand and multiplier.

While the implementation of a multiplier circuit can provide a more accurate result, this advantage comes at the cost of processing time and silicon die area which makes them inconvenient for usage, for example, in ASICs or other hardware. Multiplication can be time-consuming which may require pipelining the calculation (run over multiple clock cycles) or reducing the clock speed. The implementation of the multiplier is a matter of design choice.

In some implementations, the adder/subtractor 160 may be coupled to a 2:1 MUX 158. The 2:1 MUX 158 inputs are coupled to the pre-calculated values c and d from the entry extractor 130 and the control input is coupled to the speculative interpolation output of the entry selector 140. When the speculative interpolation outputs 0, the 2:1 MUX 158 outputs the first pre-calculated value c. When the speculative interpolation outputs 1, the 2:1 MUX 158 outputs the second pre-calculated value d. The 2:1 MUX 158 output is coupled to the adder/subtractor 160.

The adder/subtractor 160 receives the partial value from the shifter 154, the slope from the slope calculator 156 and the output of the 2:1 MUX 158 to determine the approximated value 170. The adder/subtractor 160 calculates the approximated value 170 based on the coupled inputs. The slope received from the slope calculator 156 indicates whether the partial value should be added or subtracted from the pre-calculated value c or d. For example, if the slope is positive, the partial value is added to the pre-calculated value c or d. If the slope is negative, the partial value is subtracted from the pre-calculated value c or d.

The output of the 2:1 MUX 158 indicates whether the first value c or the second value d should be used in the calculation. For example, when the requested value is in between the first value c and the second value d, the 2:1 MUX 158 outputs the first value c. The partial value is added to the first value c to obtain the approximated value between the pre-calculated values c and d. In another example, when the requested value is outside of the pre-calculated values c and d, the 2:1 MUX 158 outputs the second value d. The partial value is added to the second value d to obtain an approximated value outside of the first pre-calculated value c and d.

In some aspects, the formula used by the adder/subtractor 160 to determine the approximated value 170 can be represented by a different formula for each potential scenario where the slope is positive or negative and the requested value is in between or outside the pre-calculated values. For example, when the slope is positive and the requested value is between the pre-calculated values, the approximated value can be calculated with the formula: c+shift_out. When the slope is positive and the requested value is outside the pre-calculated values, the approximated value can be calculated with the formula: d+shift_out. When the slope is negative and the requested value is between the pre-calculated values, the approximated value can be calculated with the formula: c−shift_out. When the slope is negative and the requested value is outside the pre-calculated values, the approximated value can be calculated with the formula: d−shift_out.

Figure 8D:
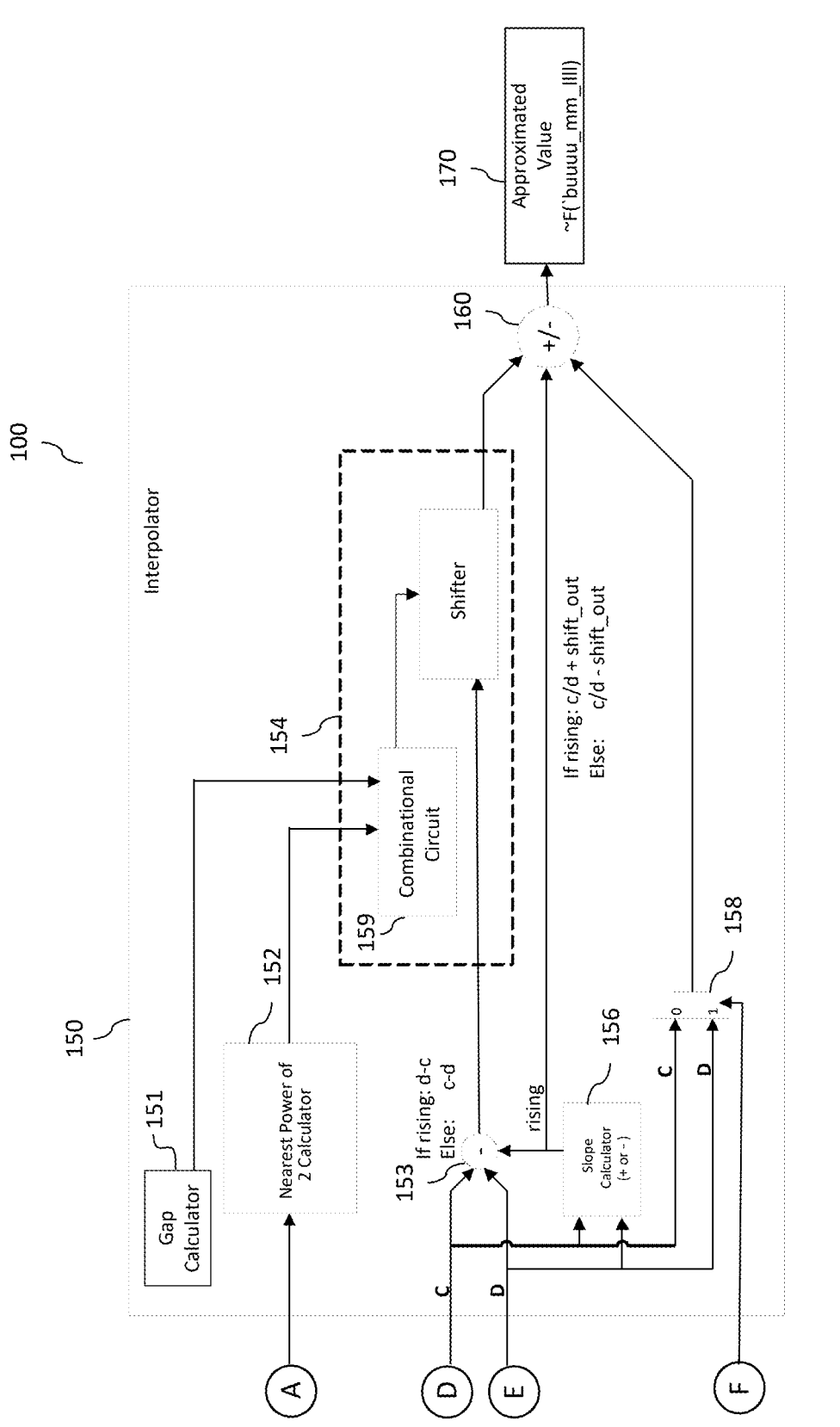
FIG. 8D depicts an alternate implementation of the interpolator shown in FIG. 8C.

In an alternate implementation shown in FIG. 8D, the shift can be performed in a single operation based on the net shift of the left and right shifts. For example, the nearest power of two calculator 152 and the gap calculator 151 can be connected to a combination circuit 159 within the shifter 154 that determines the overall shift. This can be implemented by taking the difference between the left shift and the right shift and shifting that amount either left or right depending upon which was greater. As with the gap calculator 151, the nearest power of two calculator, and the slope calculator, this circuit can be implemented with logic gates or other digital circuitry.

Figure 9A:
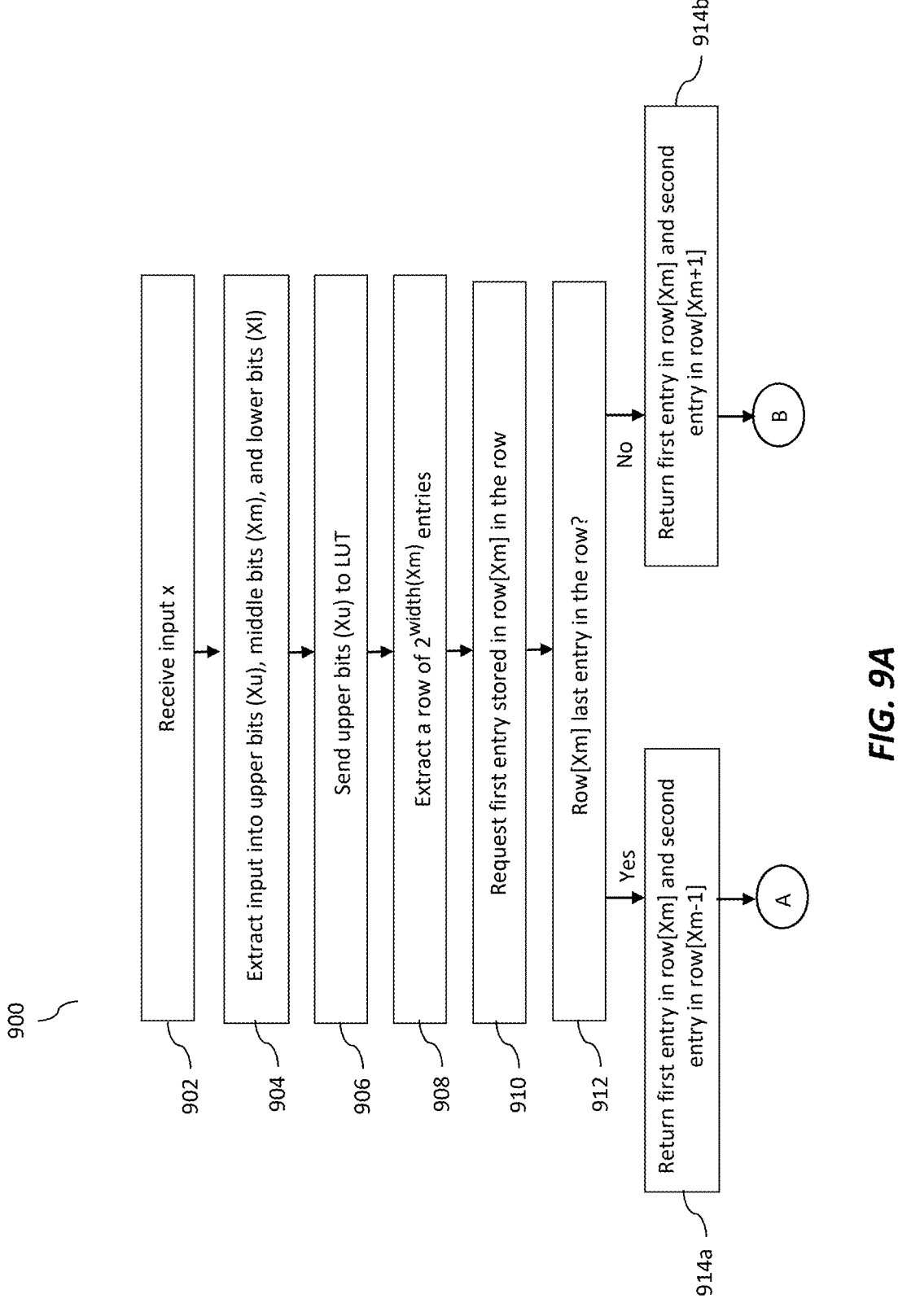
FIGS. 9A-9B (collectively FIG. 9) depict a flowchart of an approximation system, according to an example implementation.
Figure 9B:
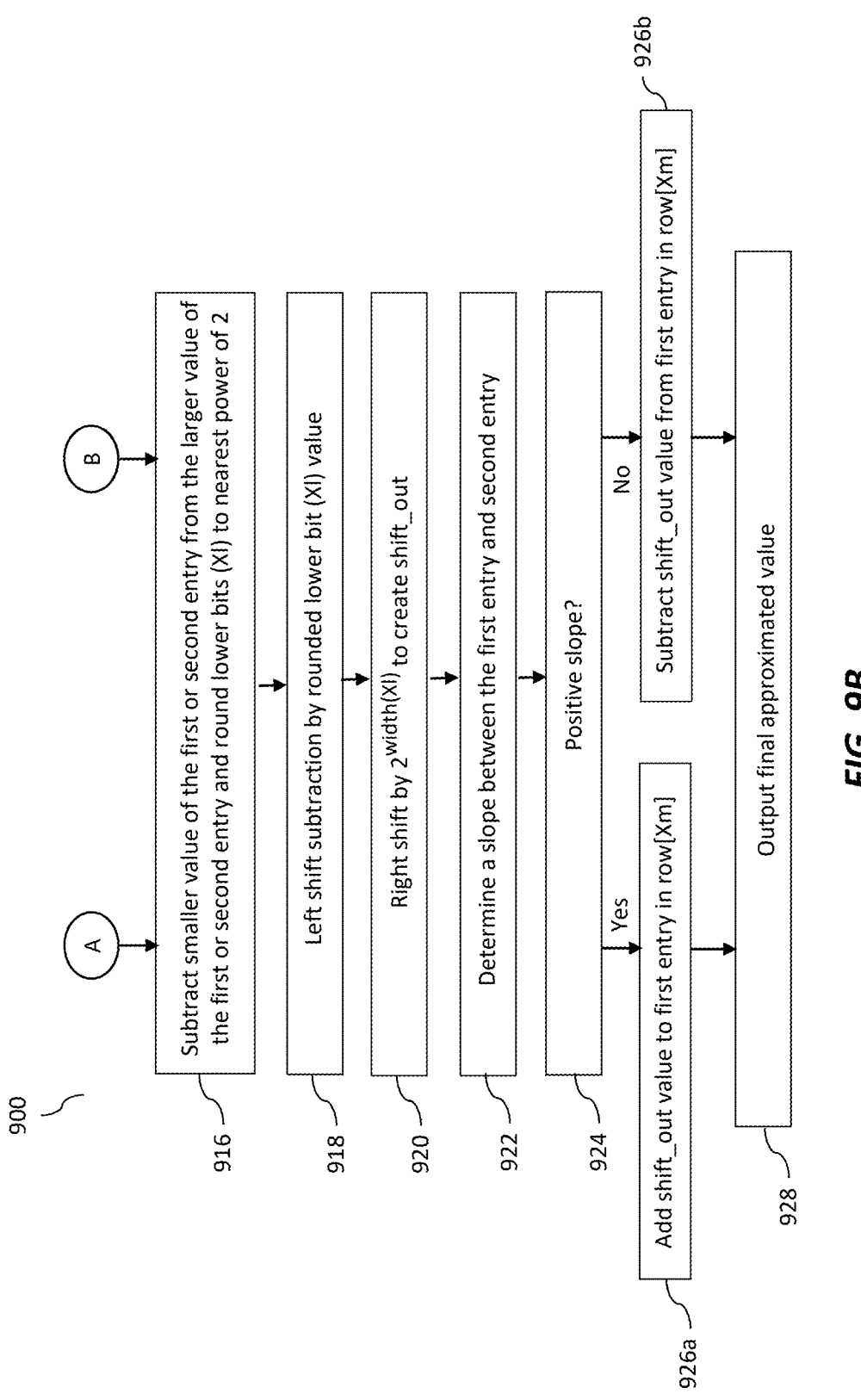

FIG. 9 depicts a flowchart 900 of estimating an approximated value from a look up table (LUT), according to example implementations. The process begins at step 902 which involves receiving an input x. A LUT approximation logic is queried with the input x. The input x may have three or more bits. In typical applications, the input would have more bits, e.g., eight bits or more depending on the accuracy of the LUT (number u and m bits) and resolution of the estimate (number of l bits). Upon receiving the input x, the process flows to step 904 where the input x is extracted into upper bits Xu, middle bits Xm, and lower bits Xl.

The process flows to step 906 where the upper bits Xu are sent to the LUT to retrieve a row of entries. The process flows to step 908 where the row is extracted from the LUT. The extracted row has $2^{width(Xm)}$ entries, where width(Xm) is the width of the middle bits Xm.

The process flows to step 910 to request a first entry row[Xm] in the extracted row. In step 912, the process determines whether the first entry row[Xm] is the final entry in the row. When row[Xm] is the last entry in the row, the process flows to step 914a. Otherwise, the process flows to step 914b. In step 914a, the first entry stored row[Xm] and a second entry stored in row[Xm−1] is returned. In step 914b, the first entry stored in row[Xm] and the second entry stored in row[Xm+1] is returned.

The process moves to step 916, where the smaller value of the first entry or second entry returned in step 914a or 914b is subtracted from the larger entry and the lower bits Xl is rounded to the nearest power of 2. The subtraction in step 916 occurs in parallel with rounding the lower bits Xl in step 916.

The result of the subtraction is shifted left by the rounded lower bits Xl value in step 918. Subsequently, in step 920, the left-shifted value is shifted right by $2^{width(Xl)}$, where width (Xl) is the width of the lower bits Xl. The right-shifted value resulting in a partial value or creating a shift_out value.

In step 922, the process determines a slope between the first entry stored in row[Xm] and the second entry stored in row[Xm+1] or row[Xm−1]. While step 922 occurs after steps 916, 918, and 920, step 922 may occur at any point simultaneously with or before steps 916, 918, and 920.

Upon determining the slope between the first entry and second entry, the process flows to step 924 to determine whether the slope is a positive or rising slope. The shift_out value may be added or subtracted from the first entry stored in row[Xm] to determine the final approximated value. When the slope is a positive or rising slope, the process flows to step 926a where shift_out is added to the first entry stored in row[Xm]. Otherwise, the process flows to step 826b where shift_out is subtracted from the first entry in row[Xm]. In the final step 828, the final approximate value is output.

Advantageously, the process of FIG. 9 can be performed in as few as three clock cycles. The input is received (e.g., latched) in a first clock cycle and the LUT entries are retrieved in a second clock cycle. The logic steps of determining the approximated value can then be performed during third clock cycle and latched at the output. If the clock rate is faster than the computation can be performed, additional clock cycles might be used, e.g., latch based on the output of a shift register or counter.

Figure 10:
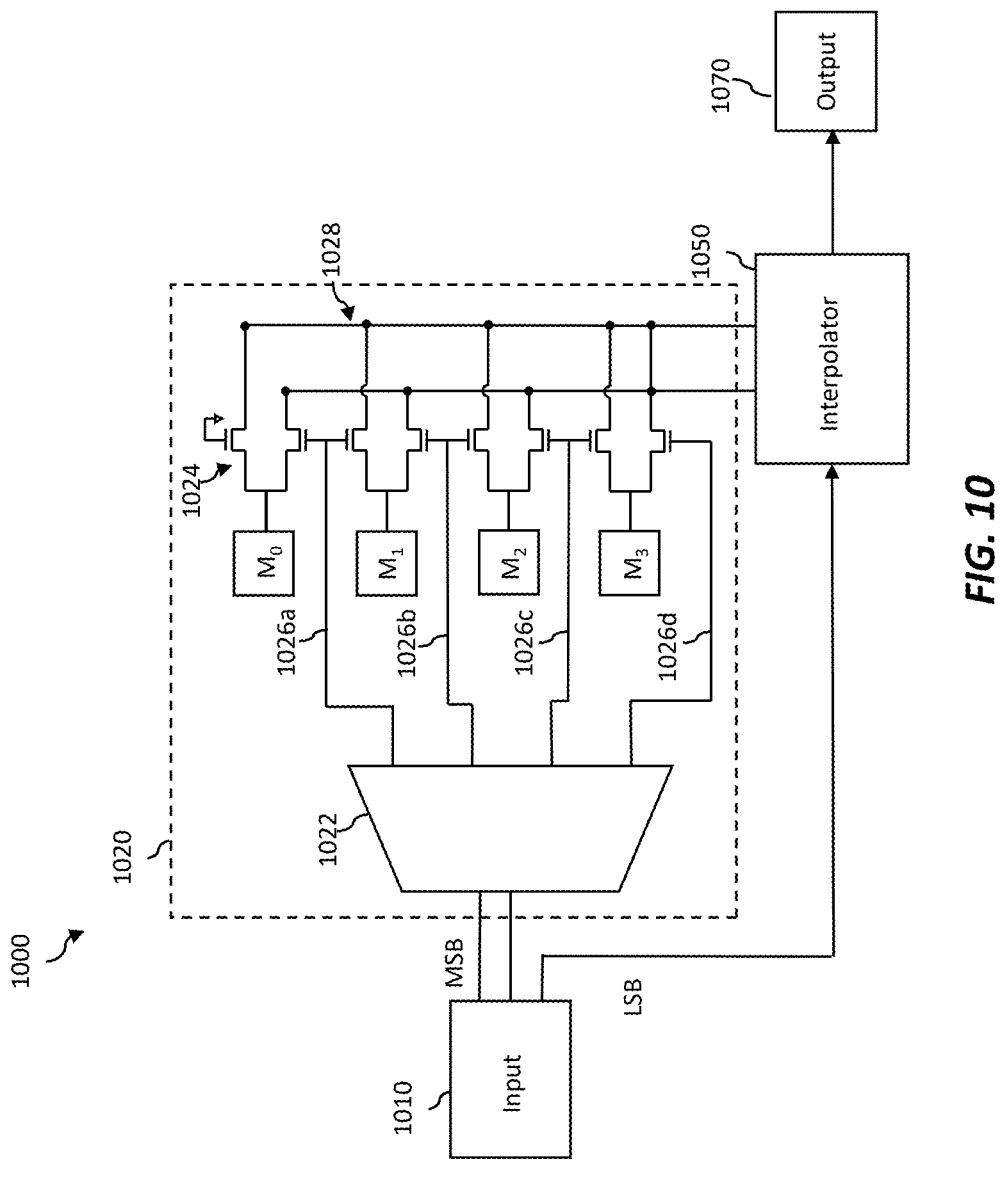
FIG. 10 depicts an alternative implementation of an approximation system.

FIG. 10 illustrates an alternative implementation of an approximation system 1000 that utilizes a look up circuit 1020 and interpolator 1050. The system 1000 comprises an input 1010 that carries a number of input bits. In this example, the input bits are divided into most significant bits (MSB) and least significant bits (LSB). No intermediate bits are needed in this example. The MSB are coupled to the look up circuit 1020 and the LSB is coupled to the interpolator 1050.

The look up circuit 1020 includes a decoder 1022, memory cells $M_0$, $M_1$, $M_2$, $M_3$ (collectively M), and a plurality of switches 1024. (In this case, a "memory cell" refers to all of the bits at a particular memory location, these bits being output in parallel.) The decoder 1022 is coupled to the input 1010 to receive the most significant bits. The most significant bits can consist of multiple bits, which serve as an address or selection code. In this simplified example, only four memory cells are shown. These can be addressed with two bits. In practical examples, the memory would be much larger, e.g., 16 bits or 64 bits or 128 bits, and so on. The decoder 1022 operates as a standard address decoder analyzing the input and activating a corresponding output line based on the predefined truth table or logic function programmed into the decoder. The decoder 1022 translates the input into a unique combination of output signals, which can be used to select corresponding switches 1024. For example, if the MSB input is 01, the select line 1026b would be activated and the other select lines inactivated.

The outputs of the decoder 1022 are coupled to a plurality of switches 1024 which are connected to the memory cells M. The switches are devices or components used in electronic circuits to establish, maintain, and terminate connections between the memory cells M and the output lines 1028. In particular, the switches 1024 operate by connecting or disconnecting the corresponding memory cells to the output lines 1028 of the lookup circuit. The switches are typically transistor switches, e.g., NMOS transistors, which operate as access transistors.

Each memory cell M is coupled to two output lines 1028 via two associated switches 1024. The select lines 1026 are coupled so that the contents of two adjacent memory cells with be simultaneously retrieved. When the switches are activated, the connected memory cells are output to an input of the interpolator 1050. In an example implementation, the memory cells M are designed to store pre-calculated values. For example, the memory cells can store pre-calculated values for a computational function. The design and operation of memory cells can vary depending on the memory technology, such as DRAM, SRAM, flash memory, or magnetic storage.

Continuing with the example above, the decoder 1022 receives the MSB 00 which activates the first output line 1026a connected to a first switch connected to memory cell $M_0$ and a second switch connected to memory cell $M_1$. In this example, the contents of memory cells $M_0$ and $M_1$ are input to the interpolator 1050. The interpolator 1050 receives the first input and the second input from the active memory cells and performs the interpolation as discussed above. In this case, no intermediate bits are needed since the LUT will always output two adjacent entries. As before, the interpolator 1050 utilizes the LSB to determine a partial value along the slope between the first value and the second value. The partial value is added to or subtracted from the first value to determine and output an approximated value 1070.

The issue related to the final entry in the MSB can be addressed as before by modifying the illustrated circuit to retrieve the contents of the final memory locations when the last of memory location is addressed. The illustrated example, however, is simplified as no interpolation will occur when memory location $M_3$ is selected. The interpolator 1050 will receive two copies of this entry and output the same. In effect, the approximation has fewer data points.

A number of implementations for approximating more precise values in a LUT have been disclosed. These various implementations can be used in a number of contexts. Some examples will be described here.

Field-Programmable Gate Arrays (FPGAs) are reconfigurable hardware devices that include an array of programmable logic blocks and interconnects. LUTs can be a fundamental building block in FPGA applications. For example, each logic block might contain one or more LUTs, which are used to implement combinational logic functions. The LUTs in FPGAs are usually small, with sizes ranging from 4 to 6 inputs. By programming the contents of the LUTs, designers can implement various digital circuits and logic functions on the FPGA fabric. LUTs in FPGAs provide flexibility and allow for efficient implementation of complex combinational logic.

Another example is color management systems. Color management systems often use LUTs to perform color space conversions and color transformations. In digital imaging and printing workflows, LUTs can be used to map colors from one color space to another. For example, a 3D LUT can be used to convert colors from the RGB color space to the CMYK color space for printing. The LUT stores pre-computed color transformation values, allowing for fast and accurate color conversions. LUTs are also used for color calibration, where they store the mappings between the input color values and the calibrated output values to ensure consistent color reproduction across different devices.

Yet another example is digital signal processing (DSP) systems. In DSP systems, LUTs can be used for various purposes, such as function approximation, waveform generation, and signal conditioning. For example, in a sine wave generator, a LUT can store pre-computed sine values for different phase angles. Instead of calculating the sine function on-the-fly, the system can fetch the corresponding sine value from the LUT based on the current phase angle. This approach is faster and more efficient than real-time computation. Similarly, LUTs can be used for generating other waveforms, such as square waves or triangular waves, by storing the appropriate sample values in the table.

Embedded systems and microcontrollers can also utilize LUTs for various purposes. For example, a microcontroller may use a LUT to store pre-computed values for a specific mathematical function or to hold configuration data for different operating modes. LUTs can also be used for efficient implementation of complex Boolean functions in embedded systems. Instead of using a series of conditional statements or complex logic, the system can store the output values for different input combinations in a LUT and retrieve them quickly. This approach saves memory and reduces computation time, which is crucial in resource-constrained embedded environments.

Another growing area that can utilize lookup tables is in neural networks, which are widely used for solving complex computational problems such as pattern recognition, data classification, function approximation, and data processing across many technological fields including computer vision, speech recognition, natural language processing, and others. A neural network includes interconnected nodes or "neurons" arranged in different layers that exchange data between each other. The connections have numeric weights that can be tuned, which are used to perform computational operations on the input data and adjust the strengths of the connections. Neural networks "learn" from labeled training data examples by adjusting the connection weights to minimize errors.

One of the core computations in training and executing neural networks is calculating an "activation function" applied to the weighted sum of inputs to each neuron. The activation function introduces non-linearity into the neural network models. Common activation functions include sigmoids, hyperbolic tangents, rectified linear units (ReLUs), and others. Instead of computing these functions on-the-fly, which can be computationally expensive, a look up table (LUT) can be used to store pre-computed values of the activation function for a range of inputs. During inference, the input to the activation function is used as an index to retrieve the corresponding output value from the LUT, avoiding the need for complex calculations.

One approach to accelerating activation function calculations is to pre-compute the activation function results for a range of input values and store the results in lookup tables. Unlike existing techniques for generating and utilizing lookup tables, which have limitations when applied to neural network activation function computations, the implementations disclosed herein can be utilized more efficiently. The input value ranges can be diverse, and sufficient precision is required to avoid accuracy degradation. Multidimensional lookups can be implemented and compact lookup table representations can reduce model memory footprints.

Although this disclosure describes or illustrates particular operations as occurring in a particular order, this disclosure contemplates the operations occurring in any suitable order. Moreover, this disclosure contemplates any suitable operations being repeated one or more times in any suitable order. Although this disclosure describes or illustrates particular operations as occurring in sequence, this disclosure contemplates any suitable operations occurring at substantially the same time, where appropriate. Any suitable operation or sequence of operations described or illustrated herein may be interrupted, suspended, or otherwise controlled by another process, such as an operating system or kernel, where appropriate. The acts can operate in an operating system environment or as stand-alone routines occupying all or a substantial part of the system processing.

While this disclosure has been described with reference to illustrative implementations, this description is not intended to be construed in a limiting sense. Various modifications and combinations of the illustrative implementations, as well as other implementations of the disclosure, will be apparent to persons skilled in the art upon reference to the description. It is therefore intended that the appended claims encompass any such modifications or implementations.

What is claimed is:

1. A circuit comprising:
an input having a plurality of input nodes including upper bit nodes and lower bit nodes;
a look up table (LUT) comprising address inputs coupled to receive upper bits from the upper bit nodes; and
an interpolator with an input coupled to the lower bit nodes, the interpolator configured to simultaneously retrieve contents from a first look up table entry and a second look up table entry based on the upper bits and to estimate an approximated value using lower bits from the lower bit nodes and the contents retrieved from the first look up table entry and the second look up table entry, wherein the input nodes further comprise middle bit nodes, the circuit further comprising:
entry detection logic with an input coupled to the middle bit nodes;
a first multiplexer with a data input coupled to an output of the LUT and a control input coupled to a first output of the entry detection logic; and
a second multiplexer with a data input coupled to the output of the LUT and a control input coupled to a second output of the entry detection logic, wherein the interpolator comprises a second input coupled to an output of the first multiplexer, and a third input coupled to an output of the second multiplexer.

2. The circuit of claim 1, wherein the interpolator comprises:
a nearest power of two calculator with an input coupled to the lower bit nodes at a first input of the interpolator;
a subtractor with an input coupled to the second and third input of the interpolator;
a slope calculator with an input coupled to the second and third input of the interpolator;
a gap calculator;
shift circuitry with a first input coupled to the output of the subtractor, a second input coupled to the output of the nearest power of two calculator, and a third input coupled to the gap calculator; and
an adder/subtractor having a first input coupled to an output of the shift circuitry and a second input coupled to the output of the slope calculator.

3. The circuit of claim 1, wherein the look up table is configured to simultaneously retrieve the contents from the first and second look up table entries by activating a single select line that allows the contents of the first look up table entry and the second look up table entry to be simultaneously retrieved.

4. The circuit of claim 1, wherein the look up table is implemented in a memory comprising:
a first output line and a second output line;
a plurality of memory locations;
a plurality of access transistors, each memory location being coupled to an associated pair of the access transistors, wherein a first access transistor of the pair is coupled between the associated memory location and the first output line and a second first access transistor of the pair is coupled between the associated memory location and the second output line; and
an address decoder coupled to receive the upper bits, the address decoder having a plurality of output select lines, each select line coupled to both a first access transistor of one of the memory locations and a second access transistor of a different one of the memory locations.

5. The circuit of claim 1, wherein the interpolator is configured to simultaneously retrieve the contents from the first look up table entry, the second look up table entry, and a third look up table entry based on the upper bits and to estimate the approximated value using a non-linear interpolation method.

6. A circuit comprising:
an input having a plurality of input nodes including upper bit nodes, middle bit nodes and lower bit nodes;
a look up table (LUT) comprising address inputs coupled to receive upper bits from the upper bit nodes;
entry detection logic with an input coupled to the middle bit nodes;
a first multiplexer with a data input coupled to an output of the LUT and a control input coupled to a first output of the entry detection logic;
a second multiplexer with a data input coupled to the output of the LUT and a control input coupled to a second output of the entry detection logic; and
an interpolator with a first input coupled to the lower bit nodes, a second input coupled to an output of the first multiplexer, and a third input coupled to an output of the second multiplexer.

7. The circuit of claim 6, wherein the interpolator comprises:

a nearest power of two calculator with an input coupled to the lower bit nodes at the first input of the interpolator;

a subtractor with an input coupled to the second and third input of the interpolator; and a slope calculator with an input coupled to the second and third input of the interpolator.

8. The circuit of claim 7, wherein the interpolator comprises a 2:1 multiplexer with an input coupled to the second and third input of the interpolator and a control input coupled to the entry detection logic.

9. The circuit of claim 8, wherein the interpolator further comprises:

a left shifter with a first input coupled to an output of the subtractor and a second input coupled to the output of the nearest power of two calculator; and a right shifter with a first input coupled to an output of the left shifter and a second input coupled to a gap calculator.

10. The circuit of claim 9, further comprising:

an adder/subtractor with a first input coupled to an output of the right shifter, a second input coupled to an output of the slope calculator, and a third input coupled to an output of the 2:1 multiplexer.

11. The circuit of claim 8, wherein the interpolator further comprises:

a combination circuit with a first input coupled to the output of the nearest power of two calculator and a second input coupled to a gap calculator; and a shifter with an first input coupled to an output of the subtractor and a second input coupled to the output of the combination circuit.

12. A computer-implemented method comprising:

receiving a look up table address having most significant bits and least significant bits;

simultaneously retrieving, from a look up table, contents from a first look up table entry and a second look up table entry based on the most significant bits of the look up table address;

determining a slope based on the contents of the first look up table entry and the contents of the second look up table entry; and estimating an approximated value using the least significant bits of the look up table address, the determined slope, and the contents of the first look up table entry, wherein simultaneously retrieving the contents of the first and second look up table entries comprises activating a single select line that allows the contents of the first look up table entry and the second look up table entry to be simultaneously retrieved.

13. The method of claim 12, wherein the look up table address also has next most significant bits between the most significant bits and the least significant bits;

wherein retrieving the contents comprises simultaneously retrieving a row of results that contain a plurality of look up table entries based on the most significant bits; and wherein the first look up table entry and the second look up table entry are determined by the next most significant bits as well as the most significant bits.

14. The method of claim 13, wherein the look up table comprises at least four entries per row.

15. The method of claim 14, wherein the first look up table entry precedes the second look up table entry and wherein estimating the approximated value comprises determining a partial value based on the determined slope and adding the partial value to the contents of the first look up table entry.

16. The method of claim 14, wherein the first look up table entry is a last entry of the row and the second look up table entry is a second-to-last entry of the row and wherein estimating the approximated value comprises determining a partial value based on the determined slope and adding the partial value to the contents of the first look up table entry.

17. The method of claim 15, wherein determining the partial value comprises:

calculating a difference between the first look up table entry and second look up table entry;

rounding the least significant bits to a nearest power of two; and performing a bit shifting calculation based on the rounded least significant bits.

18. The method of claim 17, wherein performing the bit shift calculation comprises:

shifting the rounded least significant bits left; and shifting the left-shifted rounded least significant bits right by $2^{BI}$, where BI is a width of the least significant bits.

* * * * *